United States Patent [19]
D'Antonio

[11] 4,331,856
[45] May 25, 1982

[54] CONTROL SYSTEM AND METHOD OF CONTROLLING ION NITRIDING APPARATUS

[75] Inventor: Nicholas F. D'Antonio, Liverpool, N.Y.

[73] Assignee: Wellman Thermal Systems Corporation, Shelbyville, Ind.

[21] Appl. No.: 949,219

[22] Filed: Oct. 6, 1978

[51] Int. Cl.$^3$ .............................................. B23K 9/00
[52] U.S. Cl. ........................ 219/121 P; 219/121 PY; 219/496; 219/497; 219/490; 315/111.21; 324/117 R; 313/210; 313/231.31; 204/164; 422/186.16
[58] Field of Search ................. 219/121 P, 494, 490, 219/497, 501, 499, 495; 313/210, 231.3; 204/164, 192 E, 312, 192 C, 298; 315/111.2; 250/531, 535; 307/310, 117; 156/643–646, 345; 324/127, 45, 117

[56] References Cited

U.S. PATENT DOCUMENTS

| | | | |
|---|---|---|---|
| 2,884,511 | 4/1959 | Berghaus | 315/111 |
| 3,181,029 | 4/1965 | Berghaus | 315/111 |
| 3,536,602 | 10/1970 | Jones et al. | 204/164 |
| 3,566,079 | 2/1971 | O'Neill | 219/501 |
| 3,626,291 | 12/1971 | Yauch | 324/127 |
| 3,681,662 | 8/1972 | Spescha | 317/31 |
| 3,764,883 | 10/1973 | Staad et al. | 250/53 |
| 3,885,212 | 5/1975 | Herbert | 324/45 |
| 4,130,753 | 12/1978 | Wade | 219/492 |
| 4,130,762 | 12/1978 | Oppel | 204/298 |
| 4,142,957 | 3/1979 | Oppel | 250/531 |

OTHER PUBLICATIONS

IBM Technical Disclosure, vol. 20 #3, 8-1977, Gartne et al.

*Primary Examiner*—B. A. Reynolds
*Assistant Examiner*—M. Paschall
*Attorney, Agent, or Firm*—Fitch, Even, Tabin, Flannery & Welsh

[57] ABSTRACT

A control system and method for an apparatus to glow discharge treat (such as ion nitride) a workpiece. The apparatus includes a housing to receive a workpiece and a low pressure atmosphere of ionizable gas (nitrogen and hydrogen for nitriding), and connectors for establishing a glow discharge in the gas with the workpiece connected as the cathode. The control system and method automatically control the apparatus throughout the process, utilizing operator selected parameters (such as warm-up time, processing time, workpiece operating temperature and chamber pressure). The control system divides the selected operating temperature by the selected warm-up time to provide a straight line increase per unit time of the workpiece temperature. Initially the control system accumulates the increases at a rate higher than the straight line increase and then, as the workpiece approaches the selected operating temperature, the control system accumulates the increases at a rate less than the straight line increase. This provides a profile of the desired workpiece temperature. The control system compares the accumulated increases with the measured workpiece temperature and compares the rate of change of the accumulated increases with the rate of change of the measured workpiece temperature. It adjusts the level of electrical energy being supplied to the glow discharge in accordance with the comparison results. When the operator selected operating temperature is reached the control system terminates the profile and operates to maintain that temperature. The control system divides the selected operating pressure by the selected warm-up time to provide a profile of increasing pressure per unit time during warm-up and operates to provide the desired pressure at any time.

14 Claims, 13 Drawing Figures

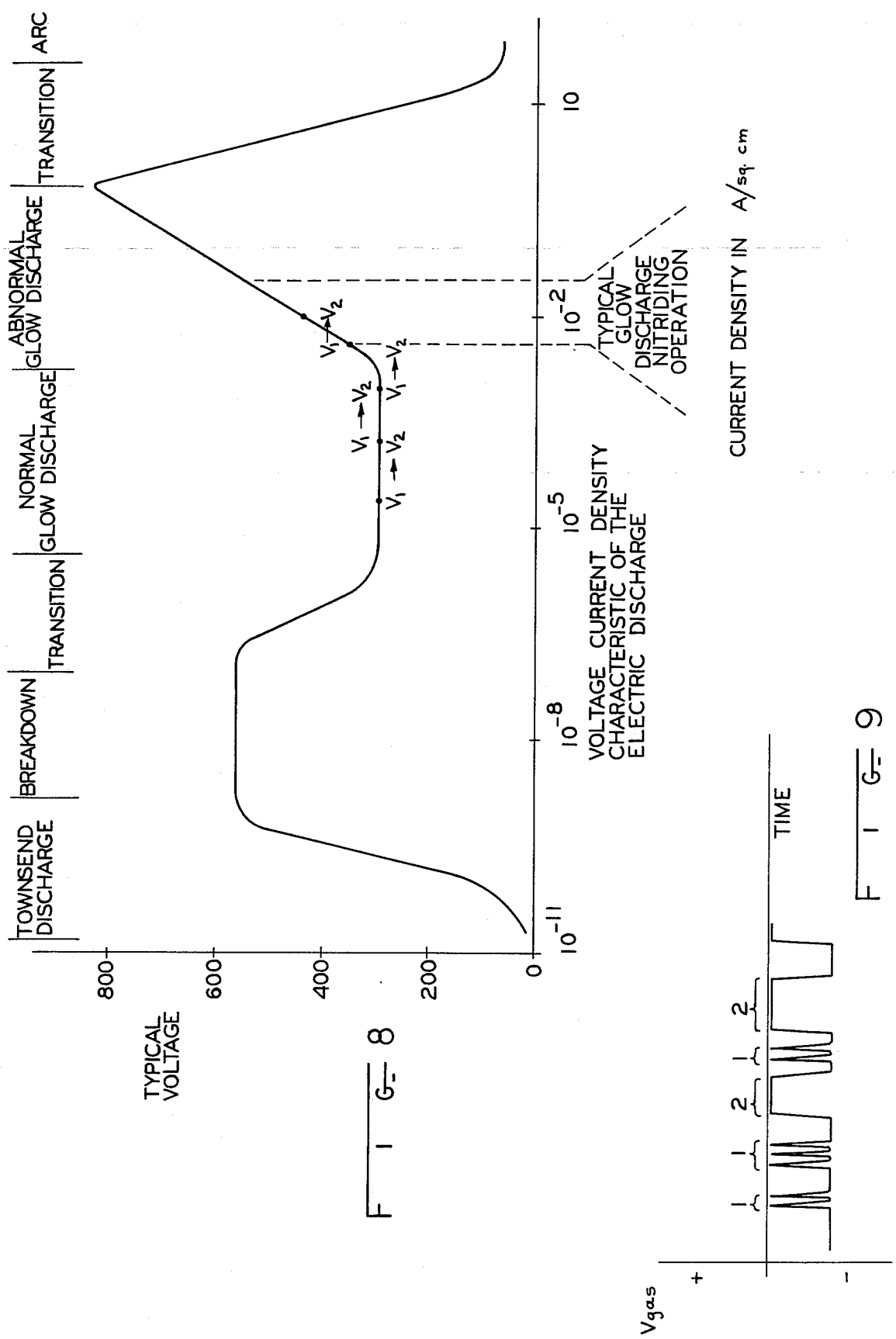

CONTROL SYSTEM AND METHOD OF CONTROLLING ION NITRIDING APPARATUS

BACKGROUND OF THE INVENTION

A low-pressure glow discharge is a well known phenomenon in physics. Consider an evacuated chamber containing a low-pressure ionizable gas and two electrodes, a positive anode and a negative cathode. When a DC potential is applied between the electrodes current will flow. For small potentials the current is small and occurs in random bursts. If the potential is made sufficiently large a continuous current will flow and, if the current is allowed to increase light will be emitted, giving rise to the name glow discharge.

Initially electrons and positive ions are accelerated by the applied field toward the anode and cathode respectively, resulting in a flow of current. If the potential is sufficiently large, the electrons can undergo "collisions" with neutral atoms, giving them enough energy for excitation (with subsequent release of that energy as visible light) or ionization (with release of an ion and a second electron). The ions can acquire enough energy from the field to deliver energy in the form of heat to the cathode or to eject one or more electrons from the cathode surface and these in turn will be accelerated toward the anode. When this occurs a self-sustaining glow discharge has been formed.

Chemically inert or active gases, or a combination of the two types can be used to produce a glow discharge. Inert gases result in surface heating only. Active gases, such as nitrogen, result in both heating and chemical change at the cathode surface. If the gas used includes nitrogen, the cathode will be bombarded by nitrogen ions. This is the physical basis for the ion nitriding form of the glow discharge process. Other similar processes such as carburizing, carbonitriding or siliciding also may be performed in a glow discharge by the choice of appropriate gas mixture.

Ion nitriding is used for case hardening metal parts that are subject to heavy wear. The momentum of the ions striking the workpiece produces the necessary heat and cleaning action on the surface and finally some of the ions will diffuse into the surface. This forms a chemical reaction with the metal resulting in a nitride compound which is very hard and durable. The "case" depth is a function of the amount of time that ions are permitted to bombard the surface under the influence of appropriately selected parameters, i.e., gas mixture, current flow, temperature, pressure and the metal used in the workpiece.

A major difficulty experienced in the past has been in getting a stable glow established. When the workpiece is first introduced into the vacuum system as a cathode, there are considerable amounts of trapped gases, moisture, oxides and other contaminates on the workpiece surface. As the workpiece is heated the contaminates are released into the glow where they are ionized and, in a local area, may create very high current density tubes. These high current density tubes are often referred to as incipient arcs or streamers. If a tube becomes sufficiently large or intense it may flip over and become an arc. Thereafter the entire glow may concentrate in the low resistance area of the arc, which becomes even more intense and can result in damage to the workpiece.

Control of the streamer or incipient arcing situation has long been a concern in ion nitriding technology and several approaches have been implemented without complete success. One of the earliest techniques simply involved placing a resistance element in series with the workpiece. When the discharge is stable and uniform with no evidence of streamer action, a fixed current will flow under the influence of steady voltage from the power supply (normally AC). The presence of streamer action tends to cause higher current flow which, in turn, causes a corresponding voltage drop in the series resistance. The net result is that the voltage available for the glow discharge is lower. The lower available voltage tends to extinguish the arc. This is a self-limiting situation. While this approach can be very effective for controlling the problem of arcing it has a gross disadvantage of large amount of power loss in the resistance, often in the order of 50% of the total power consumption. Frequently this technique is coupled with a visual determination by the operator of streamer action and a manual reduction in power by the operator when he feels uncomfortable with what he sees.

Another method suggested in a prior art is to add a series inductor in the primary side of a step up transformer used to provide the high voltage needed to ionize the gas. The inductor, of course, opposes changes in current flow associated with an arc in a manner similar to the resistor, but with less resistive power loss.

Still another method which has been suggested is the use of large banks of capacitors and associated switches on the power supply output to serve as a "dumping place" for the current flow, rather than letting it pass through the gas, when streamer action is detected.

There may be large variations in streamer activity, only some of which are indicative of a situation close to destructive arcing. In each of the prior art approaches the detection of streamer activity is followed by some form of immediate action. There is no processing of the quantity or quality of the streamer action as a basis for determining what remedial action to take.

A typical current density versus voltage characteristic of a glow discharge includes a normal glow discharge region in which the glow covers only a portion of the workpiece and in which a very small change in voltage results in a substantial change in the current density, as the glow expands to cover more of the workpiece surface. The normal glow discharge region is followed by another region called the abnormal glow discharge region in which a substantial increase in voltage is required to increase the current density, as the glow has completely covered the entire workpiece. The glow discharge treatment takes place in the abnormal glow region. In the prior art, entry of the discharge into the abnormal glow region has been determined by visual observation, i.e., when the operator felt that the glow was uniformly distributed across the workpiece.

In the prior art, control of the workpiece temperature (including increasing the temperature of the workpiece to the desired operating temperature) has been by manual adjustment of the apparatus by the operator in response to a temperature gauge reading and his impression of the condition of the glow discharge.

It is thus desirable to provide an integrated automatic control system and method for providing complete control of the operation of an ion nitriding apparatus.

BRIEF SUMMARY OF THE INVENTION

It is therefore an object of the present invention to provide an improved control system for and method of controlling an apparatus for accomplishing the glow discharge treatment of a workpiece.

It is another object of the present invention to provide such an improved control system, and method, which utilizes preselected parameters in providing automatic control of the glow discharge process.

It is yet another object of this invention to provide such a control system, and method, which automatically controls the level of electrical energy provided to the glow discharge to cause the temperature of the workpiece to rise to the preselected operating temperature over a predetermined period of time.

It is yet another object of this invention to provide such an improved control system, and method, which automatically adjusts the electrical energy level in response to a sensed condition indicative of incipient arcing of the discharge.

It is another object of the present invention to provide an improved control system, and method, which temporarily reduces the level of electrical energy upon sensing an unhealthy condition of the glow discharge.

It is still another object of the present invention to provide such an improved control system, and method, which temporarily interrupts the supply of electrical energy to the glow discharge upon sensing a predetermined unhealthy condition of the glow discharge.

It is still another object of the present invention to provide such an improved control system, and method, which significantly reduces the basic level of the electrical energy in response to a predetermined number of successive temporary electrical energy interruptions.

In accordance with one embodiment of the present invention I provide an improved control system and method for an apparatus for the glow discharge treatment of a workpiece. The apparatus includes a housing forming a chamber to receive a workpiece and a low pressure ionizable gas atmosphere, and electrical connection means for establishing a glow discharge in the atmosphere with the workpiece connected as the cathode. There is a power supply for supplying electrical energy for the glow discharge. The control system includes control means for providing a control signal to the power supply for controlling the amount of electrical energy supplied from the power supply for igniting and sustaining the glow discharge.

A reference means provides a reference signal having an increasing value representative of a desired time related increasing value of workpiece temperature. Temperature measurement means provides a temperature signal having a value representative of the extant workpiece temperature. The control system includes means for retaining the reference signal value for an earlier time and the reference signal value for a subsequent time as well as means for retaining the temperature signal value for the earlier time and the temperature signal value for the subsequent time. The control further includes comparator means for comparing the temperature signal value and reference signal value for the subsequent time to provide a temperature error signal and means for comparing the two temperature signal values for providing a temperature slope signal, the two reference signal values for providing a reference slope signal, and further for comparing the temperature slope signal and the reference slope signal to provide a slope error signal. The control means is adapted to cause the electrical energy output of the power supply to reflect both the temperature error and the slope error signals.

The control system further includes means responsive to an indication of initiation of glow discharge to provide a pedestal signal representative of the electrical energy level at the time of glow discharge initiation. The pedestal signal then is used as a base input for the control means.

The control system includes glow discharge measurement means for measuring incipient arcing conditions of the glow discharge during each of successive time periods of predetermined duration. In response to an incipient arcing condition of a predetermined severity during any timed period the control system reduces the level of electrical energy supplied to the discharge for the remainder of that timed period. The control system also includes means effective during warm-up to reduce the value of the reference signal by at least one increment in response to an incipient arcing condition of the predetermined severity. In response to an incipient arcing condition of a greater predetermined severity the control removes electrical energy supply from the glow discharge for the remainder of that timed period. The control also includes means for counting such removals of the electrical supply and means effective to eliminate the pedestal signal in response to a predetermined number of consecutive removals.

BRIEF DESCRIPTION OF THE DRAWINGS

The above-mentioned and other features and objects of this invention, as well as one manner of obtaining them, will become more apparent, and the invention itself will be more fully understood by reference to the following description taken in conjunction with the accompanying drawings wherein:

FIG. 1 is composed of FIGS. 1a and 1b, which are joined along the right hand vertical edge of FIG. 1a and the left hand vertical edge of FIG. 1b to form FIG. 1.

FIG. 3 is comprised of FIGS. 3a and 3b, which are joined along the right hand vertical edge of FIG. 3a and the left hand vertical edge of FIG. 3b to form FIG. 3.

FIG. 8 illustrates a typical voltage-current density characteristic for a gas discharge.

FIG. 9 is a voltage-time diagram showing certain illustrative effects of streamer activity on the voltage drop across the gas atmosphere of a glow discharge.

FIG. 12 is comprised of FIGS. 12a and 12b, which may be joined along the right vertical edge of FIG. 12a and the left vertical edge of FIG. 12b to form FIG. 12.

DETAILED DESCRIPTION OF PREFERRED EMBODIMENTS

Figure 1A:
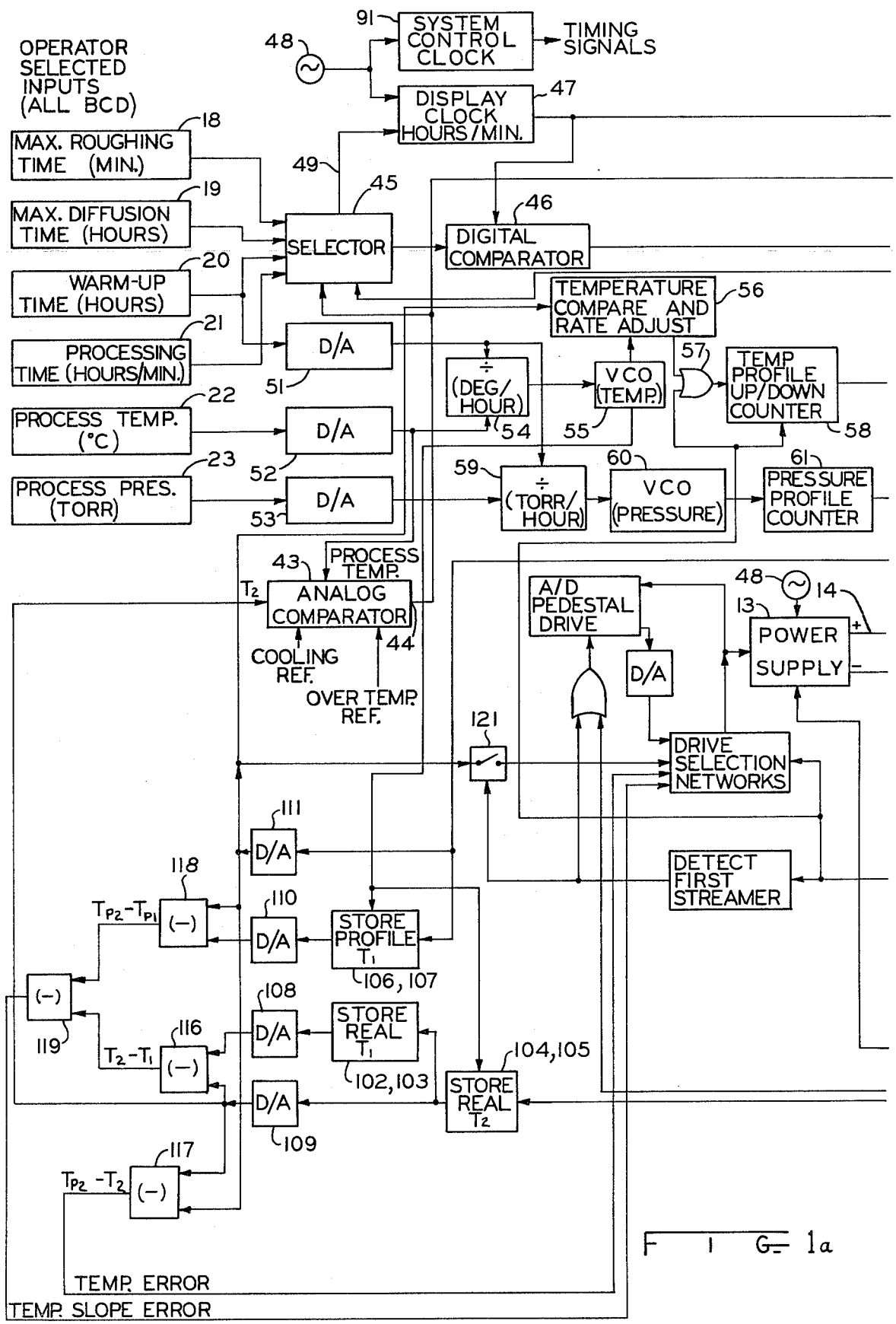
FIG. 1 is a schematic block diagram showing an illustrative embodiment of a control system in accordance with the present invention and showing the transfer of information between the various components of the control system.

Turning first briefly to FIG. 8 there is illustrated a voltage-current density characteristic of a gas discharge. As the current density increases and transition from the dark Townsend discharge to a glow discharge occurs, the glow initially will not completely cover the cathode surface. Thus, although current density is uniform within the area covered by the glow, it is nonuniform over the cathode as a whole and heating of the cathode by ion current will be nonuniform over the cathode as a whole. As more current is drawn, the voltage across the discharge stays almost constant and the area covered by the glow increases. This is the so called "normal" glow region, a historical nomenclature that may have somewhat misleading implications, since it is no more normal in its behavior than other regions of the discharge. The current increases as the current density increases during the normal discharge with very little if any increase in voltage because the increase in current results from the glow covering a larger portion of the cathode. When the glow has completely covered the cathode, any further increase in current must be accompanied with a substantial increase in current density and thus an increase in the discharge voltage. This is the so called "abnormal" glow region, and is characterized by uniform current density everywhere on the cathode. It is this region which is utilized for ion nitriding and other glow discharge treatment.

One major difficulty experienced in the past has been obtaining a stable glow discharge. When the workpiece is first introduced into the vacuum system as the cathode, there are considerable amounts of trapped gases, moisture, oxides, and other contaminants on the surface of the workpiece. As the workpiece is heated the contaminates are released into the glow where they are ionized and, in local areas, may create very high current density tubes. It is possible for these tubes to flip over from the abnormal glow area to the arc area of the characteristic curve and the whole glow may then concentrate in this low resistance area to form an intense arc which is harmful to the workpiece. These high current density tubes are incipient arcs and are sometimes called streamers. In a streamer the current density is that normally associated with an arc except that its cross sectional area is very much smaller. The tendency to high current flow in such streamers causes a corresponding decrease in the voltage across the glow discharge.

FIG. 9 shows the effect of a number of illustrative streamers. In viewing FIG. 9 it should be remembered that the workpiece functions as a cathode and has a negative conventional voltage level. Streamer activity results in a decrease in the level of the negative voltage. In FIG. 9 the voltage depressions labeled 1 are illustrative of streamers or incipient arcs of very short time duration while those labeled 2 illustrate the voltage across the atmosphere during streamers of a somewhat longer time duration.

In a typical ion nitriding process the workpiece is mounted in a chamber which is evacuated to a very low pressure, $10^{-5}$ torr for instance. The pressure then is increased to perhaps 0.1 torr by the addition of an atmosphere comprising nitrogen and hydrogen. Electrical energy is applied to establish a glow discharge in the atmosphere. One of the electrical leads is connected to the workpiece, which functions as the cathode and the other lead may be connected to the housing, which functions as the anode. As the process continues additional gas is admitted to the chamber and some gas is evacuated in order to maintain the appropriate atmosphere and pressure. The workpiece normally is mounted on a support such as a pedestal or table which electrically isolates the workpiece from the housing and provides means for making the electrical connections. The pedestal also supports a temperature probe, such as a thermocouple, for monitoring the temperature of the workpiece. It is understood that quite often a number of individual workpieces may be processed at the same time. The use of the word "workpiece" herein is for convenience only and includes within its meaning the plural. The housing forming the vacuum chamber itself, which may have a liner to facilitate periodic cleaning, normally functions as the primary anode. However, from time to time it may be desirable to use a secondary or inner anode which is electrically connected to the positive lead. The inner anode is spaced somewhat closer to the workpiece in order to reduce the spacing between the anode and the cathode.

A purpose of the present invention is to automatically control the glow discharge process, as for instance an ion nitriding process, from start to finish in accordance with operator selected parameters and in accordance with measured conditions of the discharge and workpiece.

Figure 1B:
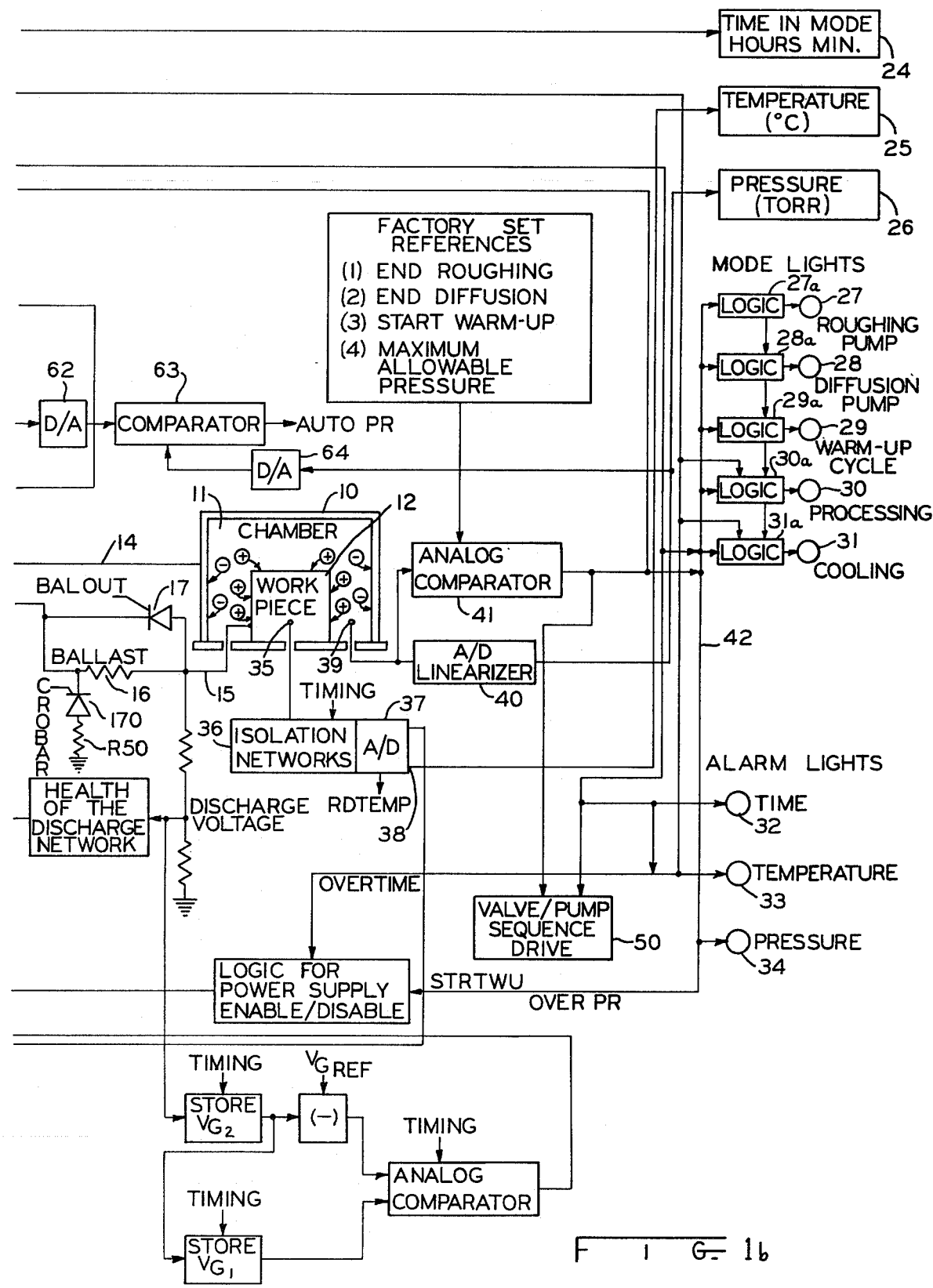

FIG. 1 illustrates various connections between different subsections and components of the control system (primarily connections for the transfer of information) in accordance with a preferred embodiment of the present invention and provides an overall general understanding of the exemplification control system and method of the present invention.

As illustrated in FIG. 1 the ion nitriding equipment includes a housing 10 defining a chamber 11 which receives a workpiece 12 and a low pressure ionizable gas atmosphere. For ion nitriding the atmosphere will include nitrogen and hydrogen. Electric energy for the glow discharge is provided by a power supply 13. Conveniently the power supply may be a current source power supply and, more particularly, a controllable current power supply. A current source tries to provide a predetermined current level to its load regardless of the load impedance. With a controllable current source power supply, the predetermined current level can be varied by varying the current control input signal. The operating characteristics of one suitable power supply would include the following:

AC input: 460VAC±10%, 3 phase 60 Hz
Full power output: 80KW

Open circuit voltage: 1000 volts capable of ½ amp drive current
Maximum full load voltage: 800 volts
Maximum full load current: 100 amps
Output current: adjustable 0–100 amps
Output voltage: adjustable 0–800 volts
Slew capability: 2000 amp/sec minimum The positive output terminal of the power supply is connected to the anode, in the illustrative embodiment the housing 10, by means of a lead 14. The negative terminal of the power supply is connected to the workpiece 12 by means of a lead 15. The workpiece is electrically isolated from housing 10 and functions as the cathode. A resistance 16 is connected in the lead 15 in parallel with a controlled rectifier 17. When a glow discharge is established the rectifier is triggered and effectively removes the resistance 16 from the negative lead 15.

The operator inputs a number of criteria or parameters used in controlling the operation of the apparatus to provide the desired process. For ease of handling by the control system each of these operator inputs is provided in the form of a "binary coded decimal" (BCD) number. Conveniently the operator inputs may be made by means of thumbwheel operated input devices and, from time to time, they will be referred to as thumbwheel values.

A typical ion nitriding apparatus initially will reduce the pressure in the chamber to a very low level, for instance $10^{-5}$ torr. This conveniently may be accomplished by use of a roughing pump and then a diffusion pump in sequence. Failure to obtain the desired low pressure could result from a valve failure, failure of a pump or a leak in the system. It is desirable for the operator to know that such a failure has occurred. To this end the present control system includes a maximum roughing time thumbwheel input 18 and a maximum diffusion time thumbwheel input mechanism 19. By use of these the operator sets the maximum allowable time that either the roughing pump or the diffusion pump can be effective. If either pump is not successful in reducing the pressure to the desired low level in the allotted time the control will alert the operator that a problem exists.

There also is a thumbwheel input mechanism 20 by which the operator inputs warm-up time. That is, the operator determines the period of time, normally one to several hours, during which the workpiece temperature is increased to the desired processing temperature. The input mechanism 21 is used by the operator to set the amount of time that the ion nitriding process will run once the workpiece has reached operating temperature. Input mechanism 22 is used by the operator to set the operating temperature of the workpiece and input mechanism 23 is used by the operator to set the pressure at which the process will be carried out.

A number of displays may be utilized in order to provide the operator with output information which is helpful in controlling and assessing the operation of the apparatus. Conveniently there may be three numeric displays, i.e., Time In Mode display 24, Temperature display 25 and Pressure display 26. The Time In Mode display informs the controller how long the control system has been operating in each of its five modes (roughing, diffusion, warm-up, processing and cooling). The Temperature display informs the operator of the actual temperature of the workpiece in degrees Celsius. The Pressure display informs the operator of the extant pressure in the chamber in torr.

The five mode lights 27–31 inform the operator which of the five operations (roughing, diffusion, warm-up, processing and cooling) the system is in at any time during the process. There are three alarm lights. The time alarm light 32 will light if the thumbwheel value for time in the current mode has been exceeded. The temperature alarm light 33 will light if the temperature of the workpiece exceeds the appropriate temperature by a predetermined amount (20° for instance). The pressure alarm light 34 will light if the chamber pressure exceeds a predetermined value for any reason (for example 20 torr).

A temperature measuring device, such as a thermocouple 35 is mounted to sense the extant temperature of the workpiece and is connected through an isolation network 36 to an analog to digital converter (A/D) 37. The isolation network is used because the workpiece may be at several hundred volts while the control circuit operates at nominally 12 volts. The thermocouple may be placed in contact with the workpiece for better temperature sensing. The voltage of the workpiece would destroy the control circuitry except for the isolation network. One output 38 of A/D converter 37 is connected to the temperature display 25 to provide a display of the real temperature of the workpiece in degrees C.

Pressure gauge means 39 is mounted in the chamber 11 to sense the pressure of the atmosphere. This mechanism 39 actually may include two gauges; i.e., a thermistor gauge for pressures down to a few millitorr and a Penning gauge for values down to $10^{-5}$ torr. Typical thermistor pressure gauges are rather non linear in response. In the exemplification control system the thermistor gauge operates in the range of pressures used during processing, when there is a need for a linear response. Therefore, the pressure gauge means 39 is connected to an analog to digital linearizer 40 which in turn is connected to the pressure display 26. The pressure gauge means 39 also is connected to an analog comparator 41 which compares the measured pressure to factory set references; i.e., an end roughing pressure, an end diffusion pressure, a start warm-up pressure and a maximum allowable pressure. The output of the analog comparator 41 is connected to a lighting bus 42. The various mode lights are connected to the bus 42 through their individual related logic circuits and the pressure alarm light is connected to bus 42. Thus an appropriate signal on the bus 42 causes various ones of the mode lights to operate indicating which mode the apparatus is in and will cause pressure alarm light 34 to light if the pressure exceeds the maximum allowable reference pressure.

The output of the analog comparator 41 is also connected to a valve/pump sequence drive 50. As previously stated, a roughing pump is used to decrease the pressure to a few millitorr and then a diffusion pump is used to further reduce the pressure to the range of about $10^{-5}$ torr. Conventionally both pumps may be energized simultaneously and appropriate valving used in order to connect the desired one of them to the chamber at any one time. The valve/pump sequence drive 50 is used to control which of the roughing and diffusion pumps is connected to the chamber 11 during the pumping down process.

There also is a temperature analog comparator 43. The inputs to it are the thumbwheel process temperature, a factory preset cooling reference temperature to determine when the cooling mode is completed, a factory preset overtemperature reference and the extant workpiece temperature ($T_2$). The analog comparator 43 compares the extant workpiece temperature ($T_2$) with each of the other temperatures and the comparison result is impressed on its output 44. The output 44 is connected to the logic circuit 30a for the processing mode light 30, the logic circuit 31a of the cooling mode light 31 and the temperature alarm light 33.

Four of the thumbwheel input mechanisms (maximum roughing time 18, maximum diffusion time 19, warm-up time 20, and processing time 21) are connected to a selector or multiplexer 45. The outputs of pressure analog comparator 41 and temperature analog comparator 43 also are connected to selector 45. These outputs cause the selector 45 to multiplex among the four operator selected inputs as the control system automatically moves through its sequence of operation. The selector 45 connects a predetermined one of these inputs to a digital comparator 46. The comparator 46 also receives an input from the display clock 47. The display clock 47 is powered from the factory power supply 48 and provides a digital time reference for comparison to the selected digital input. The selector 45 is connected to the clock 47 by means of lead 49 so that the clock 47 is reset each time the selector moves from one input to the next. The output of digital comparator 46 is connected to the lighting bus 42 and is used in determining which of the mode lights is energized. It is also connected to the time alarm light 32 and to the valve/pump sequence drive 50 to determine whether the time alarm light is energized and, in conjunction with the output of analog comparator 41, to determine the valve/pump sequence for evacuation of the chamber.

The warm-up time input mechanism 20 is also connected to a digital to analog (D/A) converter 51; the process temperature input mechanism 22 is connected to a digital analog converter 52 and the process pressure input mechanism 23 is connected to a digital to analog converter 53. The outputs of the converters 51 and 52 are connected to an analog divider 54. The divider 54 divides the operator selected processing temperature by the operator selected warm-up time. Its output voltage is representative of the straight line division warm-up speed set by the operator (degrees per hour). The analog voltage output of divider 54 is fed to a voltage controlled oscillator (VCO) 55. The frequency of the oscillator 55 is representative of the warm-up speed resulting from the settings of input mechanisms 20 and 22. This frequency is fed to the temperature compare and rate adjust network 56.

As one feature of the exemplification control system and method, the straight line temperature change derived by dividing the process temperature by the warm-up time is adjusted by network 56 to provide a variable rate. More specifically the rate is adjusted to be somewhat higher than the straight line rate at the beginning of the warm-up mode and then is reduced in response to initiation of the glow discharge. The rate is further reduced when the measured temperature of the workpiece reaches a level a predetermined number of degrees below the selected process temperature (for instance 100° C. below process temperature). The rate is reduced still further when the measured temperature of the workpiece reaches another level closer to the process temperature (for instance 50° below process temperature). These modifications of the straight line rate of temperature increase are effective to allow rapid heating of the workpiece to the desired processing temperature while taking into account the thermal lag which is often present from the surface of the workpiece to the temperature measurement point.

The output of the network 56 is fed to OR gate 57. The output of OR gate 57 is fed to a temperature profile up/down counter network 58. Basically, the up/down counter network counts the pulses from the voltage controlled oscillator 55, as modified by the rate adjust network 56. Thus the total count accumulated by the up/down counter network 58 at any time is representative of the then desired temperature of the workpiece. The output of the up/down counter network 58 is fed to a temperature comparison subcircuit which is shown in block diagram form in the lower portion of FIG. 1a and will be described later in more detail.

Warm-up time input converter 51 and process pressure input converter 53 are connected to a divider 59. The output of divider 59 is a voltage representative of the straight line increase in pressure in torr per hour as set by the operator. This voltage is fed to a pressure voltage controlled oscillator 60. The frequency of the output of oscillator 60 is fed to and counted by a pressure profile counter network 61. The total accumulated count of network 61 at any time is representative of the then desired atmosphere pressure in chamber 11. The output of the counter network 61 is connected through a digital to analog (D/A) converter 62 to a comparator 63. The output of pressure linearizer 40 is converted by a D/A converter 64 and fed to comparator 63. In effect, comparator 63 compares the desired pressure with the measured pressure and its output signal (labeled AUTOPR) is used to automatically control the pressure in the chamber. Mechanically the pressure in the chamber may be controlled by any one of a number of conventional approaches. For instance a scavange pump may be run continuously to evacuate atmosphere from the chamber at a slow rate while the source of process gas(nitrogen and hydrogen) is energized periodically, in response to an appropriate level of the AUTOPR signal, to maintain the desired pressure level. Conversely process gas (nitrogen and hydrogen) may be continuously bled into the chamber 11 and the AUTOPR signal used to periodically connect the scavange pump to the chamber for removing some atmosphere to maintain the appropriate pressure level.

Automatic operation of the ion nitriding apparatus under control of the control system in accordance with one form of the present invention begins with depression of a start button (not shown). Initially the roughing pump is effectively connected to the chamber to reduce the pressure to a selected value, for instance 10 millitorr, the diffusion pump then is connected to the chamber. A predetermined delay (30 seconds for instance) is imposed before any further action. If the chamber pressure holds at less than a predetermined level (slightly above the 10 millitorr level) at the end of the delay, the system switches into the diffusion mode. If the pressure exceeds that amount of the roughing mode is again instituted and the cycle is repeated until the transition to the diffusion mode is successful. If the transition is not successful before the operator selected maximum roughing time has been exceeded the time alarm light will come on and, in conjunction with the roughing pump light being on, will alert the operator that the apparatus has been unable to get out of the roughing mode.

Assuming the apparatus enters the diffusion mode the diffusion pump pulls a vacuum of the selected value (for instance $10^{-5}$ torr). Again, if the desired pressure is not obtained within the maximum diffusion time set by the operator the time alarm light will light and, in conjunction with the diffusion pump light being lit, will alert the operator that the apparatus has been unsuccessful in completing the diffusion mode.

Assuming the diffusion mode has been completed successfully, the system will automatically begin the warm-up mode by allowing process gas to enter the chamber and the pressure will increase. When the chamber pressure reaches a predetermined level (for instance 0.1 torr) the power supply is enabled and the temperature profile begins. A typical operating temperature is between 400° and 600° C. and a typical warm-up time is one to several hours. Because of the long times and large temperature changes, a digital staircase ramp is formed for stability and accuracy and an analog conversion of this ramp is applied to the voltage controllable current power supply 13 to slowly increase the current flow in chamber 11 in a highly controlled manner. If the maximum warm-up time set on input mechanism 20 is exceeded without the workpiece reaching the processing temperature set on input mechanism 22, the time alarm light will come on and, in conjunction with the warm-up cycle light being on, will alert the operator that the apparatus has been unsuccessful in causing the workpiece to reach its operating temperature.

Once the operating temperature of the workpiece is achieved, the control system acts to maintain this temperature for the time set on the processing time input mechanism 21. If for some reason the system should fail to terminate the power supply drive when the processing time is exceeded, the time alarm light will cone on and, in conjunction with the processing mode light being on, will alert the operator that the apparatus has not terminated processing as desired.

When the processing time is completed the power supply drive is terminated and the workpiece is permitted to cool. As soon as the power supply drive is terminated the processing mode light goes off and the cooling mode light goes on. When the workpiece has cooled to a predetermined temperature (200°–300° C. for example) the cooling mode light will begin to blink and will continue to blink until the operator turns off the apparatus.

As explained above, the time alarm light will come on in the event the time set for a particular mode has been exceeded, as determined by comparator 46. The temperature alarm light 33 will come on if the temperature of the workpiece exceeds either the profile temperature during warm-up or the process temperature during processing by a predetermined amount, as determined by temperature analog comparator 43. Additionally the pressure alarm light will come on if the pressure exceeds a predetermined level, as determined by pressure analog comparator 41.

Figure 2:
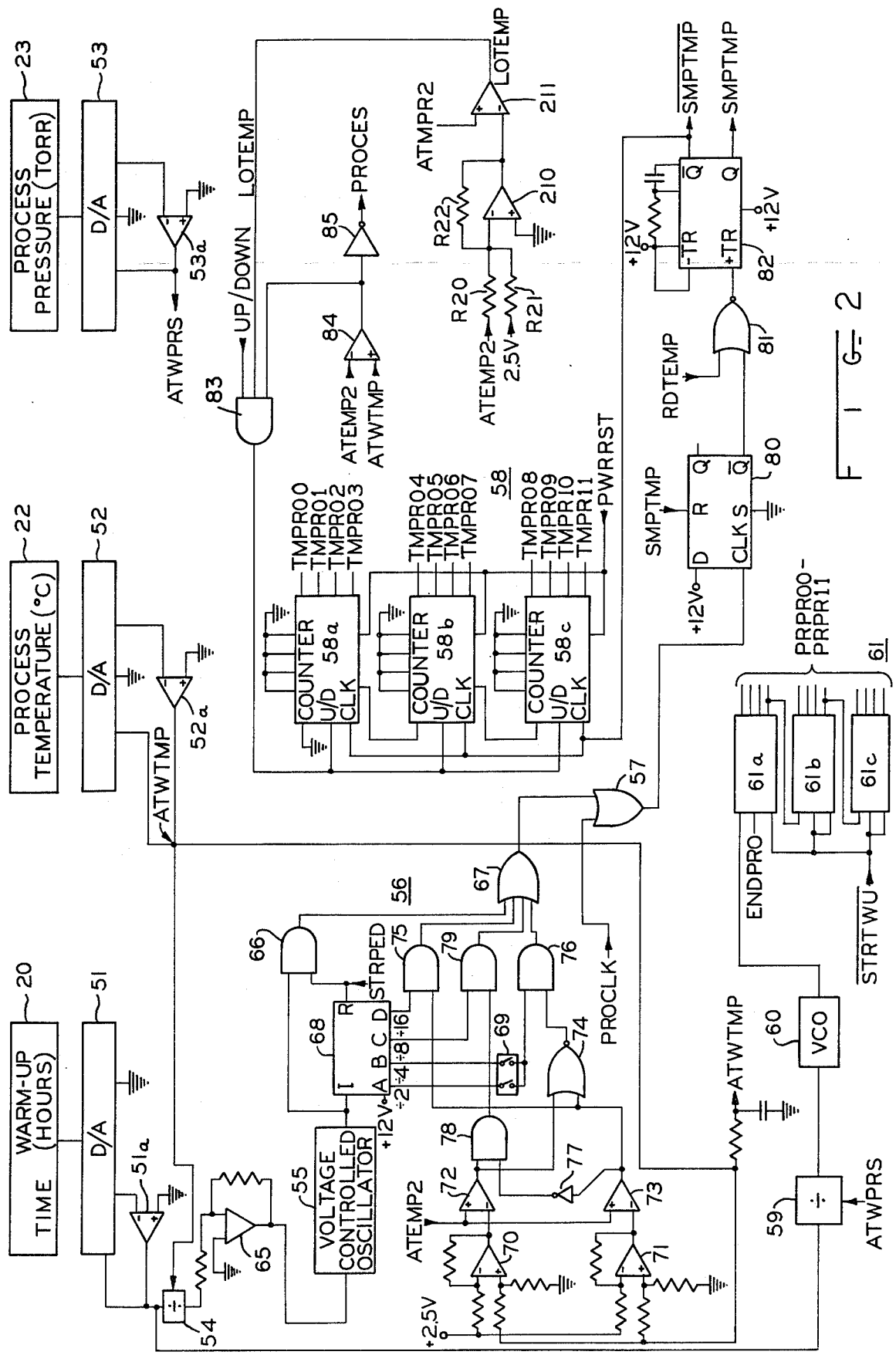
FIG. 2 is a simplified circuit diagram illustrating the temperature and pressure profile portions of the control system of FIG. 1.

Turning now to FIG. 2 (in conjunction with FIG. 1) there is shown in more detail the generation of the temperature profile and the pressure profile. In commercial ion nitriding equipment the size of the workpiece can vary from a few pounds of tons. The smaller pieces will transmit heat from the outer to the inner surfaces very rapidly while the larger ones transmit heat slowly. Since temperature sensing thermocouple 35 normally is placed toward the center of the workpiece, a long time delay can occur between the application of heat to the surface and a corresponding rise in the sensed temperature. Therefore it is advantageous to incorporate a relatively long interval between power increases to provide a reasonably accurate temperature measurement of the result of the increases.

Warm-up times are measured in hours and the signals for the required measurement intervals realistically cannot be done by analog techniques alone. For this reason the temperature profile is generated in digital form. As an example, warm-up times in the order of 1 to 10 hours and process temperatures of from 400° to 600° C. are not unusual. Assuming for the moment that the operating temperature is 600° C. and the warm-up time is to be 10 hours, the average temperature profile slope would be 60°/hr. or 1°/min. The present control system utilizes a digital staircase to generate and store this profile. The digital values are stable and essentially error free and each new value of drive current remains fixed for a period long enough for the control system to determine if the atmosphere will maintain a healthy, stable glow before proceeding to the next step in the staircase.

The thumbwheel mechanism for warm-up time 20, process temperature 22, and process pressure 23 are shown across the top of the FIG. 2. Each is connected to its associated D/A converter 51, 52 and 53 respectively. The outputs of the converters are currents which are fed to associated amplifiers 51a, 52a and 53a which convert the output signals to voltages. The output of 51a is an analog voltage representative of the operator input warm-up time. The output of amplifier 52a is an analog voltage representative of operator input temperature and is labeled ATWTMP (analog thumbwheel temperature). The output of ampiflier 53a is an analog voltage representative of the operator input pressure and is labeled ATWPRS (analog thumbwheel pressure).

The outputs from the warm-up time and process temperature converters 51a and 52a are fed to the divider 54, whose output is representative of a straight line division of the process temperature by the warm-up time (degrees per hour). This signal is fed through inverter 65 to the voltage controlled oscillator (VCO) 55. The frequency of the output of the VCO 55 is representative of the straight line increase in temperature per unit time. It is fed through a network, to be described, to the temperature profile up/down counter network 58. The network 58 includes three digital counters 58a, 58b and 58c which are interconnected to form the overall counter network. Each of the counters has four output bits for a total of 12 output bits which are labeled TMPR00 through TMPR11 (TMPR standing for temperature profile). Since there are 12 bits at the output, it is possible for these counters to reach a count of 4,096 in increments of 1. Thus the operating temperature will be divided into 4,096 separate increments and the time will be divided into 4,096 increments. For example, with a selected operating temperature of 500° each temperature increment will be approximately ⅛ of a degree. On a straight line basis a warm-up time of 6 hours would cause the counter to increase by one increment approximately once every 5 seconds (6 hrs.×60 min./hr×60 sec./min÷4,096=5.27 seconds).

In the exemplification control the temperature profile is accumulated at a rate somewhat faster than the straight line division of the process temperature by warm-up time until ignition of the glow discharge occurs. Then the rate of accumulation of the profile is reduced somewhat until a workpiece temperature 100° less than the process temperature is reached. At that time the profile accumulation is reduced further until a workpiece temperature approximately 50° below process temperature is reached. At that time the accumulation is reduced even further. With such an approach the power supply output current is brought up quickly to minimize the time from when the control system determines ignition can occur until ignition actually does occur. The reduction in the rate as the sensed workpiece temperature approaches the operator selected process temperature allows for the time delay of heat transfer through the workpiece.

The voltage controlled oscillator (VCO) 55 is designed to have an output rate substantially higher than a frequency representative of the straight line division of process temperature by warm-up time. For instance, in the exemplification control it is eight times the straight line division rate. The variation from the straight line rate of increase to the desired rate of increase is accomplished by the temperature compare and rate adjust network 56, connected between VCO 55 and the up/down counter network 58. Initially the output from VCO 55 is fed through AND gate 66, OR gate 67 and OR gate 57 to the up/down counter network 58. With this connected the counter network 58 will be pulsed once for each VCO 55 oscillation.

Very quickly after ignition occurs streamer action begins to occur. The first detected streamer will cause a signal labeled STRPED to be generated (as will be described in detail subsequently). This signal is fed into the AND gate 66 and disables that gate so that the oscillations of VCO 55 no longer are fed directly to the network 58.

STRPED also is fed to the reset (R) port of a counter 68 and enables it. VCO 55 is connected to the input port (I) of counter 68. Counter 68 has four output ports labeled A, B, C and D. The rate of the VCO output will be reduced by counter 68 at a rate depending on which of the four output ports is used. In the exemplification, at output port A the VCO rate is divided by a factor of 2, at port B it is divided by a factor of 4, at port C it is divided by a factor of 8 and at port D it is divided by a factor of 16. Ports A and B are connected to a switch 69. One and only one set of terminals of switch 69 is set to their closed position (as at the factory).

Depending on the measured temperature of the workpiece, one and only one of the ports A-D will be routed to the profile counter network 58. Amplifiers 70 and 71 provide the references for this determination. Each of these amplifiers is connected as a differential amplifier. The analog thumbwheel temperature (ATWTMP) is fed to the positive input port of each of the amplifiers. The resistance network associated with amplifier 70 is chosen so that the voltage at its output is representative of a temperature 100° C. below the thumbwheel temperature while the resistance network associated with amplifier 71 is chosen so that the output of that amplifier is representative of a temperature 50° C. below the thumbwheel temperature. The outputs of amplifier 70 and 71 are fed to the negative input ports of comparators 72 and 73 respectively. The analog voltage representative of the latest measured temperature of the workpiece (ATEMP2) is fed to the positive input port of each of comparators 72 and 73. The output of comparator 73 is connected to one input port of NOR gate 74 and is connected to one input port of AND gate 75. The output port of NOR gate 74 is connected to one input port of AND gate 76. The output port of comparator 73 is connected through an inverter 77 to one input port of an AND gate 78. The output port of AND gate 78 is connected to one input port of AND gate 79. The output ports of comparator 72 is connected to the other input port of NOR gate 74 and AND gate 78. The other input port of AND gate 75 is connected to output port D of counter 68. The other input port of AND gate 79 is connected to output port C of counter 68. The other input port of AND gate 76 is connected to switch 69 and, depending on which set of terminals in 69 had been preclosed, is connected to either output port A or output port B of counter 68.

Initially the output port of each of comparators 72 and 73 is low; both inputs to NOR gate 74 are low; and the output of NOR gate 74 is high enabling AND gate 76. Thus a count corresponding to the frequency of VCO 55 divided by either 2 or 4, depending on the setting of switch 69, is provided to OR gate 67 and thence through OR gate 57 to the up/down profile counter network 58. When the measured temperature (ATEMP2) reaches 100° C. below the thumbwheel temperature (ATWTMP), comparator 72 output goes high. This causes NOR gate 74 output to go low and disables AND gate 76. Since comparator 73 output is still low inverter 77 is enabling AND gate 78. The output of AND gate 78 then goes high enabling AND gate 79. Thereafter the signal on output port C of counter 68 is connected through AND gate 79, OR gate 67 and OR gate 57 to the up/down profile counter network 58. When the measured temperature of the workpiece reaches 50° below the thumbwheel temperature, the output of comparator 73 also goes high. Inverter 77 then goes low disabling AND gate 78 and thus AND gate 79. At the same time the output of comparator 73 enables AND gate 75. Thereafter the signal on output port D of counter 68 is connected through AND gate 75, OR gate 67 and OR gate 57 to up/down counter network 58.

The output port of OR gate 57 is connected to the clock port of a flip-flop monolithic circuit 80. The $\overline{Q}$ output port of flip-flop 80 is connected to one of the input ports of NOR gate 81. The output port of NOR 81 is connected to the positive trigger port (+TR) of a one shot type monolithic circuit 82. The $\overline{Q}$ output port of one shot 82 is connected to the input clock inputs of the serial connection of counters 58a, 58b and 58c. The $\overline{Q}$ output of flip-flop 80 is normally high and goes low on receipt of a high pulse from OR gate 57. It then will stay low until reset as a result of an appropriate signal applied to its reset port (R). The other input port of NOR gate 81 is provided with the read temperature (RDTEMP) signal. The output of NOR gate 81 is normally low and goes high when both of its input ports go low. The $\overline{Q}$ port of one shot 82 is normally low and goes high for a short pulse when its positive trigger port (+TR) goes positive. Conversely, the $\overline{Q}$ port of one shot 82 is normally high and goes low for a short pulse when the positive trigger port goes positive. As the $\overline{Q}$ port returns to its high state at the end of the pulse it triggers the up/down counter network 58 to change its count by one increment. Normally this is an up incrementation. Q and $\overline{Q}$ outputs of one shot 82 are used to control the sampling and storing of temperature signals, as will be explained in more detail subsequently. To this end they are labeled SMPTMP (sample temperature) and $\overline{SMPTMP}$, respectively.

Turning now briefly to FIG. 1 the A/D converter 37 (which is connected to thermocouple 35) repeatedly converts the workpiece temperature based voltage of the thermocouple 35 to a digital value. Each conversion is accomplished in a matter of milliseconds (one hundred and thirty-three milliseconds in the exemplification embodiment). During the conversion the read temperature output (RDTEMP) of converter 37 is high. At the conclusion of each of its conversions the RDTEMP signal goes low. As stated above the RDTEMP signal is fed to an input port of NOR gate 81. The frequency with which the RDTEMP signal goes low is much higher than the frequency with which pulses will be provided from OR gate 57 to the clock port of flip flop 80. Thus each pulse provided to the flip-flop will be fed to the positive trigger port (+TR) of one shot 82, but never during a temperature conversion operation of A/D converter 37.

Pulses from OR gate 57 are incremented into the up/down profile counter network 58 as follows. A pulse out of OR gate 57 causes the $\overline{Q}$ port of flip-flop 80 to go low. Shortly thereafter the RDTEMP signal to the other input port of NOR gate 81 also goes low as the A/D converter 37 completes its next temperature conversion. This results in a positive going pulse from NOR gate 81 to the positive trigger port of one shot 82. The Q port (SMPTMP) of one shot 82 momentarily goes high. This signal is fed to the reset port of flip-flop 80 causing the $\overline{Q}$ port of 80 to return to its high state. Simultaneously the Q port of one shot 82 momentarily goes low and then returns high. As the $\overline{Q}$ port of 82 returns high, it triggers counter network 58 to count by one increment.

An AND gate 83 is connected to the up/down control ports of the counters 58a 58b and 58c. The enabling port of AND gate 83 is connected to the output of a comparator 84. The positive input port of comparator 84 is fed the analog thumbwheel temperature signal (ATWTMP) while the negative input port of comparator 84 is fed the analog of the latest sensed workpiece temperature (ATEMP2). So long as the sensed workpiece temperature is less than the thumbwheel temperature the output of comparator 84 will be positive and AND gate 83 will be enabled. Counters 58a, b and c thus will count up or down depending on the UP/DOWN and the LOTEMP input signals to AND gate 83 (generation of these signals will be explained in more detail subsequently). Once the measured temperature of the workpiece exceeds the thumbwheel temperature the output of comparator 84 goes low and AND gate 83 is disabled to any additional up counts. The output of comparator 84 also is fed to an inverter 85. The output of the inverter 85 is labeled PROCES. When this signal goes high (comparator 84 output low) operation of the apparatus will be converted from warm-up to process, as wil be explained subsequently.

The circuitry for providing the pressure profile is shown in the lower left hand portion of FIG. 2 and is somewhat simpler than the temperature profile circuitry as the pressure profile is accumulated on a straight line basis. The analog value of warm-up time and the analog value of thumbwheel pressure (ATWPRS) signals are fed to analog divider 59. The output voltage of divider 59 is representative of the torr per hour increase in pressure desired. This voltage controls voltage controlled oscillator (VCO) 60 whose frequency is representative of the torr per hour increase in pressure. The output of oscillator 60 is fed to the pressure profile counter network 61, including counters 61a, 61b and 61c. These counters have 12 output ports labeled PRPROO-PRPR11 (PRPR indicates pressure profile). Thus the pressure profile word has 12 bits and may have 4,096 individual values. The count by counter network 61 is enabled on receipt of the STRTWU signal which occurs in the beginning of warm-up and ends on the receipt of ENDPRO (end profile) signal.

Figure 4:
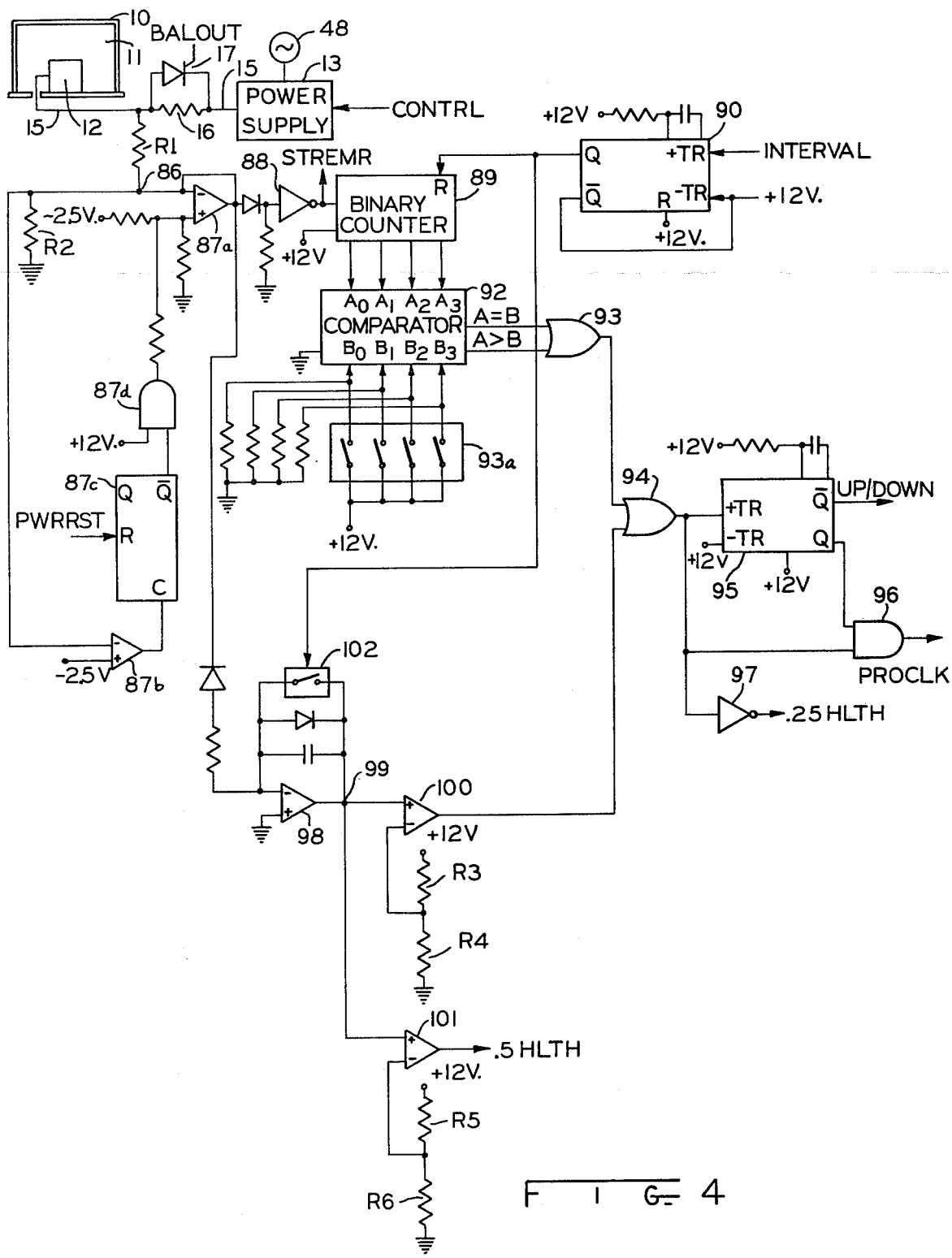
FIG. 4 is a simplified schematic circuit diagram illustrating the health of the discharge subsystem of the control system of FIG. 1.

Referring now to FIG. 4, there is shown in more detail the "health of the discharge" subsytem or network of the exemplification control circuit. This subsystem determines if a marginal condition is likely to develop into a destructive arc within the glow discharge and provides a control signal for taking corrective action if such a condition is developing. To this end, the health of the discharge subsystem continuously monitors the voltage across the gas atmosphere and compares it to a reference value. The comparison results are accumulated and used to modify the electrical energy from the power supply. Additionally, the health of the discharge subsystem provides a signal responsive to the occurrence of the first streamer as an indication that ignition of the glow discharge has occurred.

Referring briefly to FIG. 9 it will be remembered that a streamer or incipient arc causes a decrease in the level of the negative voltage across the gas. The health subsystem measures the voltage across the gas and senses dropouts, such as those indicated in FIG. 9 for instance. It makes its measurements during repetitive intervals of a predetermined time length. It counts the number of streamers or dropouts, and if the number of dropouts in an individual interval exceeds a predetermined number, it provides a signal. It also accumulates or integrates the time of the dropouts and if the accumulated time in an interval exceeds a predetermined portion of the interval length it generates a signal. In the exemplification embodiment, depending on the percentage of the timed interval occupied by streamers the health of the discharge subcircuit may generate two different signals.

A resistance network including resistors R1 and R2 is connected between the negative lead 15 (from the power supply 13 to the workpiece 12) and ground. The divider network drops the chamber voltage to a value at the junction 86 between R1 and R2 that can be handled easily by integrated circuitry. The signal at the junction 86 is representative of the voltage across the glow discharge. In the exemplification embodiment R1 is 200 K and R2 is 2.2 K. This provides approximately a 100 to 1 drop from the chamber voltage to the voltage at junction 86. Thus the normal voltage at junction 86 would be about −10 volts maximum. This voltage is applied to the inverting port of a comparator 87a. The noninverting port of comparator 87a has a reference voltage applied to it. In the exemplification embodiment this is a −2.5 volts. Normally the voltage at junction at 86 is of a higher value (greater in a negative sense) than the −2.5 V reference voltage. Under this condition the output of comparator 87a will be high and the output of inverter 88 will be low. When a streamer or incipient arc occurs the chamber voltage falls significantly. When the voltage across the gas discharge goes low, the reference voltage on the noninverting port of comparator 87a will have a greater negative value than the voltage of junction 86 applied to the inverting port of comparator 87a and the output of comparator 87a will go low. This causes the output of inverter 88 to go high. This high signal indicates the occurrence of a streamer and is labeled STREMR.

Prior to ignition of the glow discharge the chamber voltage is low. This can result in comparator 87a incorrectly sensing streamer activity, which also is indicated by low chamber voltage. Thus it is desirable to disable comparator 87a prior to ignition. To initially disable comparator 87a, the $\overline{Q}$ output of a flip-flop 87c is normally high. This enables AND gate 87d and causes its output to go high. The output of AND gate 87d is fed to the noninverting port of comparator 87a. A high output from AND gate 87d forces the output of comparator 87a high. This is indicative of no streamer activity and in effect disables comparator 87a. A second comparator 87b, having the same output sense as comparator 87a, is connectedto junction 86. Upon ignition of the glow discharge, a voltage will develop across the chamber. This forces the output of comparator 87b to go high. This trigger flip-flop 87c and its $\overline{Q}$ output goes low; causing AND gate 87d output to go low. This enables comparator 87a to respond to future decreases in chamber voltage. The flip-flop 87c is reset by the power rest (PWRRST) signal.

The output of inverter 88 is fed to a counter 89 which counts the positive going streamer signals. The reset port of counter 89 is connected to the Q port of a monostable multivibrator 90. The positive trigger port (+TR) of the monostable 90 is provided with a recurring signal labeled INTERVAL. This signal conveniently may be one of the timing signals from the system control clock 91 (shown in FIG. 1). Each time monostable 90 is triggered by the INTERVAL signal it resets the binary counter 89. Thus the binary counter counts streamer signals for repetitive intervals of predetermined length. In the exemplification embodiment the INTERVAL signal occurs once each thirty-three milliseconds and the binary counter counts streamers which occur in successive thirty-three millisecond intervals.

The count of the binary counter appears on its four output ports as a digital code representative of the number of streamers which have occurred. These output ports are connected to a digital comparator 92 and form the A word of the comparator, consisting of the four bits $A_0$, $A_1$, $A_2$, and $A_3$. The B word ($B_0$, $B_1$, $B_2$, and $B_3$) may be factory preset by use of a bank of dual in-line switches 93a. A typical digital comparator has a number of output ports. In the exemplification embodiment two are utilized. That is, the one which goes high when the A word equals the B word and the one which goes high when the A word is greater than the B word. These two ports are connected to OR gate 93. Any time the A word is equal to or greater than the B word the output of OR gate 93 will go high. In the exemplification embodiment a typical B word is sixteen. In such case, any time the number of streamers sensed and counted by binary counter 89 during a thirty-three millisecond time interval is equal to or greater than sixteen the output of OR gate 93 goes high. The output of OR gate 93 is fed to one of the input ports of OR gate 94 so that when OR gate 93 goes high the output port of OR gate 94 goes high.

The output of OR gate 94 is fed to the positive trigger port of monostable 95. The $\overline{Q}$ output port of monostable 95 is normally high and goes low when the positive trigger port goes high. The $\overline{Q}$ signal is labeled UP/DOWM. It will be recalled this signal is used to determine whether the temperature profile up/down counter network 58 counts up or down. The Q port of monostable 95 is normally low and goes high when the positive trigger port goes high; that is, when the output of OR gate 94 goes high. The Q port is connected to one of the input ports of AND gate 96, the other input port of AND gate 96 is connected to the output of OR gate 94. The output of AND gate 96 (labeled PROCLK for profile clock) is used to assure that the temperature profile up/down counter network 58 is counted down at least one increment each time OR gate 94 goes high. The arrangement shown provides the appropriate timing between the UP/DOWN signal and the PROCLK signal, as each of the components has a finite operational time. More specifically, as soon as OR gate 94 output goes high AND gate 96 will be enabled. The UP/DOWN signal from the $\overline{Q}$ goes low at the same time that the Q signal goes high. AND gate 96 has a very small but finite delay before the PROCLK signal goes high. This assures that the UP/DOWN signal goes low before the PROCLK signal goes high. Referring briefly to FIG. 2 it will be seen that when UP/DOWN signal goes low the output of AND gate 83 goes low so that counters 58a, 58b and 58c will count down. The PROCLK signal is fed to OR gate 57 and when it goes high it assures that the counters will count at least one increment regardless of the oscillations from voltage control oscillator 55.

Returning again to FIG. 4, the output of comparator 87a also is fed to the negative input of an integrating amplifier 98. When streamer activity causes comparator 87a to go through a positive to negative transition a negative voltage will appear on the input of integrating amplifier 98. With a negative voltage at its input the output of amplifier 98 will have an increasing positive voltage, which appears at junction 99. Each time monostable 90 resets binary counter 89 it also closes a switch 102 which removes the integrated voltae signal at junction 99. Thus integrating amplifier 98 accumulates or integrates the time of streamers for the same thirty-three millisecond interval as counter 89 counts the number of streamers.

The output voltage of integrating amplifier 98 is applied to the positive input port of each of comparators 100 and 101. The negative input port of each of these comparators is fed a reference voltage by means of resistance type voltage divider. In the exemplification control system the resistances R3 and R4 of the network for comparator 100 are chosen such that the output voltage of integrator 98 will become greater than the reference voltage for comparator 100 when streamer activity has occurred during approximately 25% of an available time interval; i.e. for about eight milliseconds. Similarly the resistances R5 and R6 of the divider for comparator 101 are chosen so that the output of integrator 98 becomes greater than the reference voltage on comparator 101 when streamer activity has occurred for approximately 50% of an available timed interval; i.e. about sixteen milliseconds.

When the output of integrator 98 becomes greater than the reference voltage for comparator 101 the output of comparator 101 (labeled 0.5 HLTH)goes high. The output of comparator 100, which goes high when the outputof integrator 98 becomes greater than the reference voltage for comparator 100, is connected to an input port of OR gate 94. The output of comparator 100 going high has the same effect as previously described for the output or OR gate 93 going high. Thus the UP/DOWN signal goes low and the PROCLK signal goes high in response to either a predetermined count of streamers occurring within a timed interval or the time occupied by such streamers reaching a predetermined percentage of the interval. Also the output of OR gate 94 is fed to an inverter 97. Each time the output of OR gate 94 goes high the output of inverter 97 (labeled 0.25 HLTH) goes low.

The control system uses the 0.25 HLTH and 0.5 HLTH signals in assuring that the uniformity of the glow discharge is maintained within acceptable bounds during both the warm-up phase and the processing phase of the nitriding operation. This contributes both to the quality of the finished product, by avoiding damaging arcs, and to the overall efficiency of the system.

As previously stated, the operating temperature and the warm-up time are determined by the operator. If the operator selects too short a warm-up time for the final operating temperature, the temperature profile may rise somewhat faster than the apparatus can increase the workpiece temperature, particularly if the workpiece has a large thermal mass. If this occurs a substantial gap may develop between the profile temperature (ATMPR2) and the measured workpiece temperature (ATEMP2). This will increase the temperature error signal (ERTEMP) and tend to overdrive the power supply in an effort to raise the workpiece temperature as rapidly as the profile temperature is rising.

It is desirable to prevent such overdriving of the power supply to that end the profile subcircuit of FIG. 2 includes circuitry for generating a low temperature signal (LOTEMP) in case the profile temperature exceeds the measured workpiece temperature by some predetermined margin, for example 50° Celsius. The ATEMP2 signal is fed to an amplifier 210 through resistance $R_{20}$. The amplifier 210, in conjunction with resistances $R_{20}$, $R_{21}$ and $R_{22}$ and a reference voltge of 2.5 volts, adds a voltae representative of 50° to ATEMPT2. The output of amplifier 210 (ATEMP2+50° C.) is fed to the inverting port of a comparator 211. The profile temperature signal (ATMPR2) is fed to the noninverting port of comparator 211. When ATMPR2 is larger than (ATEMP2+50° C.), the output of comparator 211 (LOTEMP) goes low. This low state of the LOTEMP signal acts through AND gate 83 to cause the temperature profile up/down counter network 58 to count down to reduce the profile.

Figure 3A:
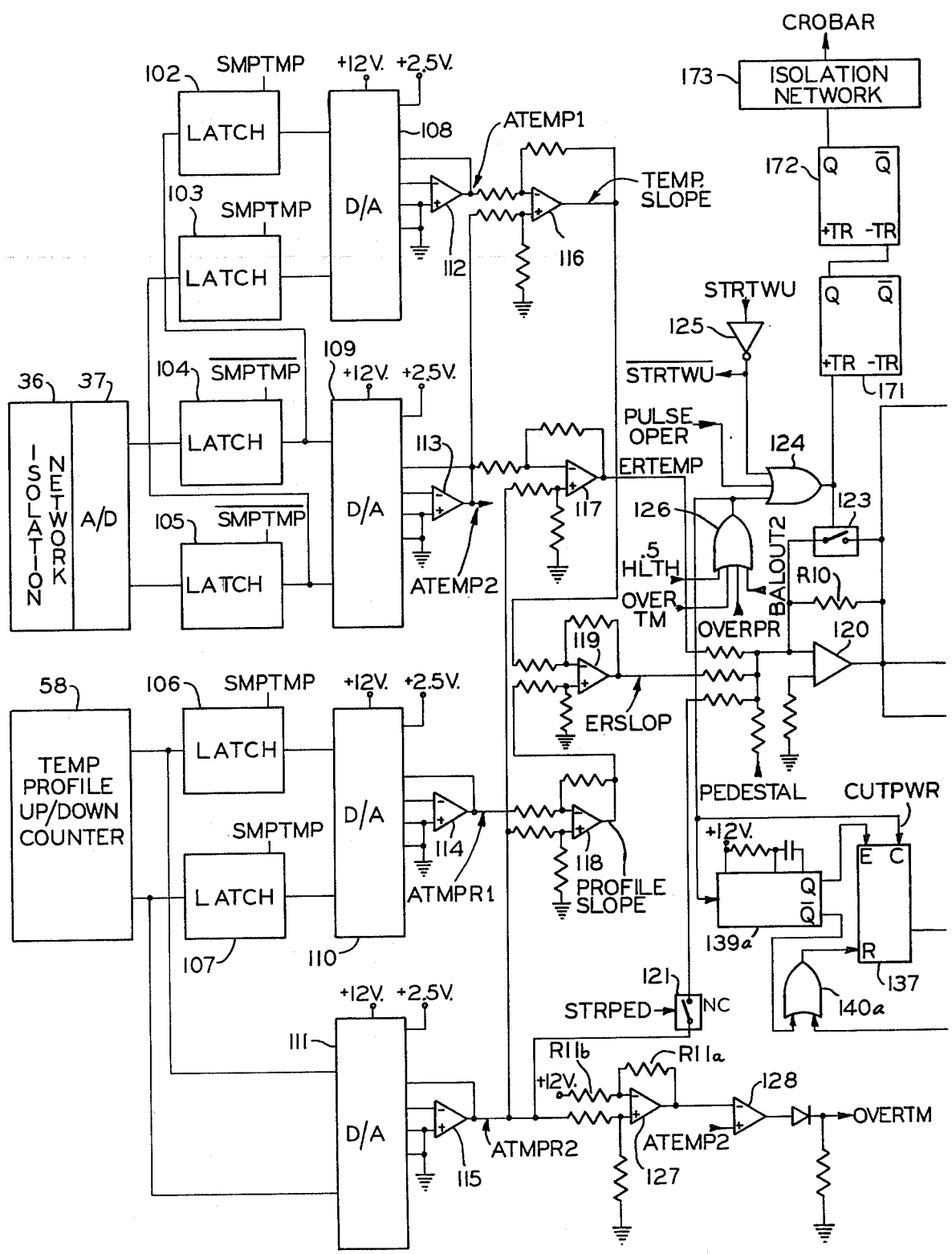
FIG. 3 is a simplified schematic circuit diagram illustrating the error signal and pedestal signal portions of the control system of FIG. 1.
Figure 3B:
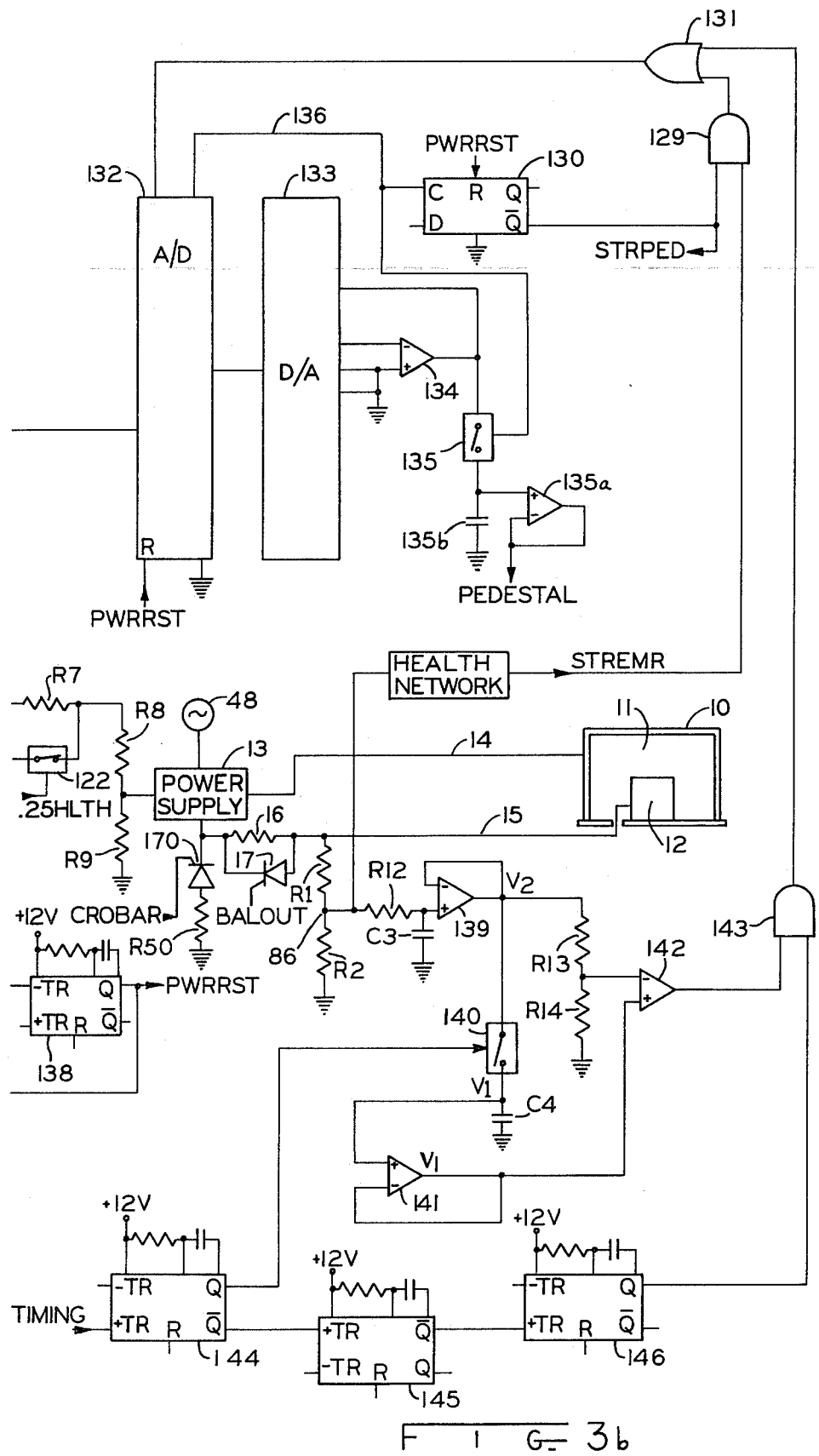

Referring now to FIG. 3, in conjunction with FIG. 2, there is shown the subcircuit for the temperature control. The analog to digital (A/D) converter 37 provides a digital word which is repeatedly updated and is representative of the measured or sensed temperature of the workpiece. The temperature profile up/down counter network 58 provides a digital word which is repeatedly updated and is representative of the desired temperature of the workpiece, based on the operator inputed processing temperature and warm-up time. The control system takes repetitive readings of both the sensed workpiece temperature and the profile temperature; makes comparisons to provide a temperature error signal which is representative of the variation between the measured workpiece temperature and the desired temperature and to provide a temperature slope error signal which is representative of the variation between the rate of change in the profile temperature and the rate of change in the measured workpiece temperature.

More particularly $T_{P1}$ indicates the profile temperature from an earlier measurement time and $T_{P2}$ indicates the profile temperature of a subsequent measurement time. Likewise, $T_1$ indicates the measured temperature from the same earlier measurement time and $T_2$ indicates the measured temperature at the later measurement time. Since the profile temperature is a staircase, the earlier value $T_{P1}$ is taken from the profile counter network 58 just before profile counter network is updated to the new value $T_{P2}$. The new value $T_1$ is taken from the latches that are storing $T_2$ just before they are updated to a new $T_2$. Subtracting the profile values yields $(T_{P2}-T_{P1})$ and subtracting the measured temperature values yields $(T_2-T_1)$. Since the $(T_{P2}-T_{P1})$ and $2-T_1)$ measurements are made over the same time interval, their difference is an indication of the slope error between the profile temperature rate of change and the measured temperature rate of change. Thus computing $(T_{P2}-T_{P1})$ minus $(T_2-T_1)$ provides the temperature rate or slope error signal. The actual temperature error is found from the most recent temperature measurements by computing $(T_{P2}-T_2)$. The timing for this computation is coincident with the timing of the computation of the slope error.

FIG. 3 shows in some detail the subsystem for making and utilizing these computations. Toward the left hand side of this diagram there is a column of six latches numbered 102-107 respectively. In the exemplification control system these latches are implemented by six individual chips and operate in pairs; that is, 102 and 103 form a composite latch, 104 and 105 form a composite latch and 106 and 107 form a composite latch. It will be remembered that each of the binary words forming the measured workpiece temperature signal and the profile temperature signal includes 12 bits. A typical commercially available chip is capable of latching six bits. Thus for ease of construction and economics latch chips are used in pairs. However, it will be understood that other configurations of latches can be employed if desired.

The output from the measured temperature A/D converter 37 is connected to the input of latches 104 and 105. The output of latches 104 and 105 connected to the input of latches 102 and 103, respectively. The output of the temperature profile up/down counter network 58 is connected to the input of latches 106 and 107 and also is connected to a digital to analog converter 111. The output of latches 104 and 105 are is connected to a digital to analog converter 109 and the output of latches 106 and 107 is connected to a digital to analog converter 110. The output of latches 102 and 103 is connected to a digital to analog converter 108.

Latches 102 and 103 are gated by the SMPTMP signal; latches 104 and 105 are gated by the $\overline{\text{SMPTMP}}$ signal and latches 106 and 107 are gated by the SMPTMP signal. It will be remembered that the positive going edge of an SMPTMP signal occurs prior to the positive going edge of the companion $\overline{\text{SMPTMP}}$ signal (see FIG. 2). The latches 102-107 are triggered by these positive going edges. Assuming that the latches have signals from a prior measurement, the updating of the signals occurs as follows. Latches 102 and 103 are triggered by the positive going edge of signal SMPTMP and update their signal to the signal level which had previously been stored on latches 104 and 105 and latches 102 and 103 then will store measured temperature $T_1$. Shortly thereafter the positive going edge of companion signal SMPTMP triggers latches 104 and 105 which update their signal from A/D converter 37 and it becomes measured temperature value $T_2$. The same forward going edge of signal SMPTMP which triggered latches 102 and 103 also triggers latches 106 and 107 so that they store the signal level of temperature profile up/down counter network 58 and their signal value becomes $T_{P1}$. The digital to analog converter 111 is connected directly to the temperature profile up/down counter and is continuously provided with the value $T_{P2}$. In this regard it will be remembered that the signal level of up/down counter 58 changes only at the transition interval of VCO 55 (or some division thereof) and thus always provides the latest value of $T_{P2}$. Therefore, it is not necessary to latch the value $T_{P2}$.

The four D/A converters 108-111 convert the four digital temperature signals $T_2$, $T_1$, $T_{P2}$, and $T_{P1}$ to their equivalent analog values. Since the outputs of the converters are currents rather than voltages, they are connected to amplifiers 112, 113, 114 and 115, respectively. The amplifiers convert currents from the D/A converters 108-111 into the equivalent values of voltage. Thus the output of amplifier 112 is the analog value of old measured temperature (called ATEMP1); the output of amplifier 113 is the analog value of the most recent measured temperature (called ATEMP2); the output of amplifier 114 is the analog of the prior profile temperature (called ATMPR1) and the output of amplifier 115 is the analog of the latest profile temperature (called ATMPR2).

Differential amplifier 116 subtracts ATEMP1 from ATEMP2. Its output signal is representative of the temperature slope, that is, the change in the measured workpiece temperature during the latest measuring period. Differential amplifier 117 subtracts ATEMP2 from ATMPR2 and its output signal is representative of the temperature error (called ERTEMP). Differential amplifier 118 subtracts ATMPR1 from ATMPR2 and its output signal is representative of the profile slope, that is the change in the profile temperature during the latest measurement period. Differential amplifier 119 subtracts the temperature slope signal (output of amplifier 116) from the profile slope (output of amplifier 118) and its output signal is representative of the slope error (called ERSLOP). The temperature error signal (ERTEMP) and the slope error signal (ERSLOP) are fed to the input of a summing amplifier 120. Initially the ATMPR2 signal also is fed to the input of the summing amplifier 120 through a normally closed switch 121. Thus, initially, the summing amplifier inputs are the temperature profile, the temperature error and the temperature slope error signals.

The profile temperature, and thus the level of electrical energy supplied by the power supply, is increased at a rapid rate until ignition occurs so that ignition may be accomplished quickly. Shortly after ignition occurs the first streamer will be sensed and will result in the generation of a STRPED signal, which is applied to the switch 121 and opens it. This disconnects the ATMPR2 signal from summing amplifier 120. The ATMPR2 signal is replaced by a fourth input (designated PEDESTAL) to the amplifier 120. Generation of the PEDESTAL signal will be discussed subsequently.

The output of amplifier 120 is fed through a resistance type voltage divider network consisting of resistances R7, R8 and R9 to the control input of power supply 13 and serves as the control signal for the power supply 13, which obtains its electrical power from the factory supply 48. In the exemplification embodiment the power supply 13 uses an input control signal of 0 to 100 millivolts in order to provide a 0-100 amp output. Summing amplifier 120 provides a 0-10 volt output for a chamber current of 0-100 amps. Resistances R8 and R9 function as a voltage divider so that the output of amplifier 120 is conformed to the required input range of power supply 13. The resistance R7 is paralleled by a switch 122 which is of the normally closed type. The 0.25 HLTH signal controls switch 122 and when the 0.25 HLTH signal goes low switch 122 is opened. This places R7 in series with R8 and R9 and effectively drops the voltage level of the control signal into power supply 13. This reduces the output voltage current from the power supply to the chamber. It will be remembered that the 0.25 HLTH signal goes low whenever OR gate 94 goes high and OR gate 94 goes high whenever a predetermined number of streamers occur within a measured time interval or the accumulated time of the streamers within the time interval equals a first predetermined portion of the interval (see FIG. 4).

Turning again to summing amplifier 120, it will be noted that a switch 123 parallels the amplifier feedback resistance $R_{10}$. The condition of switch 123 is controlled by the output of an OR gate 124. One input of OR gate 124 is the output of an inverter 125 (called $\overline{STRTWU}$). The input to inverter 125 is the start warm-up signal (STRTWU). The STRTWU signal is provided by pressure analog comparator 41 (see FIG. 1) in response to the atmosphere pressure in the chamber reaching a factory set value at which ignition can occur, for instance 0.1 torr.

Prior to the beginning of warm-up the STRTWU signal is low; $\overline{STRTWU}$ signal is high and the output of OR gate 124 is high. This causes switch 123 to be closed so that no output voltage can be developed by summing amplifier 120, and the power supply can provide no current to the chamber. Once the pressure in the chamber reaches the factory preset level, for instance 0.1 torr, the STRTWU signal goes high; the $\overline{STRTWU}$ goes low, the output of OR gate 124 goes low and switch 123 opens. Amplifier 120 then can develop a signal driving the power supply 13 in order to provide current to the chamber so that ignition can occur.

Another input of OR gate 124 is the output of an OR gate 126 which has four inputs. The first of these is the 0.5 HLTH signal. As discussed with regard to FIG. 4, the 0.5 HLTH signal goes high when streamer activity has occupied a high predetermined portion of a measurement interval, in the exemplification embodiment 50% of an interval. If 0.5 HLTH goes high the output of OR gate 126 goes high, the output of OR gate 124 goes high and switch 123 closes. This effectively removes the feedback resistor $R_{10}$ from summing amplifier 120 and prevents it from developing an output signal. Consequently the power supply 13 ceases to provide current to the chamber. At the end of that measurement interval the 0.5 HLTH signal again goes low, switch 123 opens and power is restored to the chamber.

The second possible signal fed to OR gate 126 is the over pressure signal (OVERPR). It is generated by the analog comparator 41 (see FIG. 1). If the pressure in the chamber exceeds a predetermined maximum level, the OVERPR signal goes high and remains high until the pressure is reduced. This causes the power to be removed from the chamber for so long as the excess pressure condition exists.

The third possible signal fed to OR gate 126 is the over temperature signal (OVERTM). It goes high if the actual temperature of the workpiece exceeds profile temperature by a predetermined value, 20° C. in the exemplification control. To this end the ATMPR2 signal from amplifier 115 is fed to the positive port of a differential amplifier 127 (see FIG. 3). The output of amplifier 127 is fed back to its negative input port through a resistance R11a. R11a and R11b are so sized that amplifier 127 effectively adds 20 degrees to the ATMPR2 signal. The output of amplifier 127 is fed to the negative input port of a comparator 128. The measured temperature signal ATEMP2 is fed to the positive port of comparator 128. Comparator 128 effectively subtracts the augmented profile signal from the measured signal and, when the measured signal becomes greater that the augmented profile signal, the output of comparator 128 goes high. The output of comparator 128 is the over temperature signal OVERTM. An over temperature condition will result in power being removed from the chamber for so long as the excessive temperature condition remains.

The fourth possible signal fed to OR gate 126 is "BALOUT2". As mentioned earlier, once a glow discharge is established, the controlled rectifier 17 is triggered and effectively removes the resistance 16 from the negative lead 15. It is advantageous to remove the power supply drive when the controlled rectifier is triggered. To this end the BALOUT 2 signal is momentarily driven high while rectifier 17 is triggered. The circuitry for accomplishing this will be explained subsequently, in conjunction with the explanation of generation of the trigger signal for rectifier 17.

Any time one of the inputs to OR gate 126 goes high, its output goes high and causes the output of OR gate 124 to go high. This, in turn, closes switch 123 to remove the input drive signal from power supply 13 and effectively deenergize the power supply. Commercially available current source power supplies include output filter networks. When the power supply is turned off, the energy stored in the capacitors of the filter network is still available for the load. Thus, it is desirable to disconnect the power supply output to ground each time OR gate 124 goes high to interrupt the power supply. To this end power supply output lead 15 is connected to ground through an SCR 170 and limit resistance $R_{50}$. The output of OR gate 124 is connected to the +TR input of monostable 171. The Q output of monostable 171 is connected to the −TR of input of monostable 172. The Q output of monostable 172 is connected to an isolation network 173. The output of network 173 (labeled CROBAR) is connected to the gate of SCR 170. When OR gate 124 goes high to disable power supply 13, it also causes the CROBAR signal to go high. This fires SCR 170 to bleed the output filter charge to ground. Since the Q output of monostable 171 is connected to the −TR input of monostable 172, it is the trailing edge of the 171 Q signal which will trigger monostable 172. This provides a small time delay of the CROBAR signal and assures that power supply 13 is turned off before SCR 170 is triggered.

Referring for a moment to FIG. 4, it will be remembered that the STREMR signal is generated from the output of inverter 88 and goes high when a streamer is sensed. The health network shown in detail in FIG. 4 is indicated in FIG. 3 by a block labeled "HEALTH NETWORK" and the STREMR signal is indicated flowing from that block. The STREMR signal is one input to an AND gate 129, the other input of which is connected to the $\overline{Q}$ output of a flip-flop 130. When a warm-up operation begins $\overline{Q}$ output of flip-flop 130 is high, enabling AND gate 129. When a streamer is sensed, the STREMR signal goes high and the output of AND gate 129 goes high. AND gate 129 is connected as one input to OR gate 131 which, in turn, is connected to provide the convert signal to an analog to digital converter 132. The converter 132 is connected to the output of summing amplifier 120. When STREMR goes high, OR gate 131 goes high and triggers converter 132. Converter 132 converts the output of summing amplifier 120 to a digital value which is retained in an output latch that is part of the converter 132, as is conventional with A/D converters. The stored digital value is representative of the output of summing amplifier 120, and thus the current from power supply 13 to the chamber. This digital value is converted to an analog current value by digital to analog converter 133 and the current output of converter 133 is converted to a voltage by amplifier 134.

The converter 132 is connected to the control port of flip-flop 130 and to a switch 135 by lead 136. While converter 132 is converting the signal on lead 136 is low. This causes switch 135 to be open. At the end of the conversion by converter 132 a positive going end of convert signal is impressed on lead 136. The positive going end of convert signal closes switch 135. With switch 135 closed the voltage output of amplifier 135a responds to the voltage on capacitor 135b and provides PEDESTAL signal. The value or level of signal is representative of the output of summing amplifier 120, and thus the level of current supplied to the chamber by power supply 13, at the moment the first streamer is sensed.

The end of convert signal on lead 136 also triggers flip-flop 130 so that its $\overline{Q}$ output goes low. When $\overline{Q}$ output of flip-flop 130 goes low the STRPED signal goes low and opens switch 121. Both flip-flop 130 and switch 135 are activated by the end of convert signal on line 136. Both possess similar time delays and will cause the PEDESTAL signal from amplifier 135a to be impressed on summing amplifier 120 just as the ATMPR2 signal is removed.

With $\overline{Q}$ port of flip-flop 130 low, AND gate 120 is disabled. Subsequent STREMR signals from the health network will not result in subsequent operation of the pedestal network unless flip-flop 130 has been reset by the power reset signal PWRRST. This operation provides a pedestal input to the summing amplifier which is representative of the electrical energy provided to the chamber at the time of ignition of the glow discharge and provides that the power supply will operate at a level at least as high as that which was determined safe by the occurrence of the first streamer.

In the event the operation of the power supply results in undesirable operating conditions, as determined by repeated occurrences of the 0.5 HLTH signal, the flip-flop 130 will be reset. To this end the output of OR gate 126 is connected to the clock input of counter 137. When the output of OR gate 126 goes high to cut the power to the chamber, it forms a cut power signal (CUTPWR) which is applied to the clock input of the counter 137. If the CUTPWR signal occurs a predetermined number of times in succession (sixteen in the exemplification control) it is assumed that there is something drastically wrong with the state of the glow discharge and an output signal will be generated by counter 137. This output signal is connected to the negative trigger port of a monostable 138 causing the Q output of monostable 138 to go high. The Q output of monostable 138 is the power reset (PWRRST) signal which is applied to the reset port of flip-flop 130. This returns the $\overline{Q}$ output of flip-flop 130 to the high state which enables AND gate 129. The PWRRST signal also is applied to the reset port of the analog to digital converter 132. This resets converter 132 and eliminates its prior computation of the summing amplifier output. In this event the PEDESTAL signal is removed and the STRPED signal goes high, closing switch 121 for reconnecting the temperature profile signal to summing amplifier 120. This effectively returns the control to a preignition state.

The Q port of monostable 138 is connected to the reset port of counter 137 so that any time a power reset signal is generated the counter is reset to 0. The CUTPWR signals also are applied to a retriggerable monostable 139a so that each time a CUTPWR signal is applied to the counter 137 the monostable 139a is triggered. The $\overline{Q}$ output of monostable 139 is connected through OR gate 140a to the reset port of counter 137. If the CUTPWR signals occur with sufficient frequency monostable 139a will remain triggered, its $\overline{Q}$ will stay low. However, if the CUTPWR signals do not come with sufficient frequency, the retriggerable monostable 139a will revert to its off state; its $\overline{Q}$ signal will go high and will reset counter 137. Therefore a predetermined number of CUTPWR signals must occur within a predetermined time in order to generate a power reset (PWRRST) signal.

While the 0.5 HLTH signal will be of a recurring nature in the event of a very unhealthy glow discharge situation the other inputs to OR gate 126 do not occur with sufficient frequency to generate a power reset signal. For example, the over temperature signal goes high and remains high as long as an over temperature condition of the workpiece exists and the over pressure signal will go high and remain high as long as an over pressure condition exists. A change in each of these conditions is very slow compared to the cycle time of monostable 139a. The BALOUT2 signal only occurs when the controlled rectifier is triggered upon establishment of glow discharge. Thus the power reset signal occurs only as a result of repeated 0.5 HLTH signals, indicative of a very severe streamer or incipient arcing condition.

When the glow discharge enters the abnormal region, any increase in current is accompanied by fairly substantial increase in voltage. The particular point in the abnormal region at which a particular discharge operates will be determined by the operator selected operating temperature and the physical characteristics of the workpiece, since the power supply will provide sufficient energy to the glow discharge to maintain the workpiece at the operator selected process temperature. Once the discharge has entered the abnormal region is is desirable to increase the level of the PEDESTAL signal to correspond to the portion of the abnormal curve in which the glow discharge is operating.

The means for doing this are shown in some detail in the FIG. 3. The junction 86 of resistance divider network $R_1$ and $R_2$ (previously described in conjunction with FIG. 4) also is connected to a voltage follower amplifier 139. The $R_{12}$, $C_3$ network between junction 86 and amplifier 139 is merely an RC time constant network to slow down the effect of any variation in gas voltage so that the input voltage to amplifier 139 will not change instantaneously with streamer action. Thus, the voltage level appearing at output of amplifier 139 is representative of the extant voltage across the chamber ($V_2$). Switch 140 is connected to the output of amplifier 139 and is normally open. The capacitor $C_4$ is a sample and hold capacitor and will hold the value of the voltage at the output of amplifier 139 when the switch 140 is closed. Switch 140 is closed periodically so that a prior voltage level ($V_1$) appearing at the output of amplifier 139 may be impressed on capacitor $C_4$ for comparison with the voltage level ($V_2$) subsequently appearing at the output of amplifier 139.

Voltage follower amplifier 141 has an output which is equal to the voltage ($V_1$) on capacitor $C_4$, representative of the prior voltage across the discharge. A resistor divider network, including resistor $R_{13}$ and $R_{14}$, is connected to the output of amplifier 139. The junction between $R_{13}$ and $R_{14}$ is connected to the negative input port of comparator 142. The resistances $R_{13}$ and $R_{14}$ are sized to subtract a predetermined voltage fraction from the voltage $V_2$. In the exemplification embodiment they are sized to subtract an amount equivalent to about 50 volts at the chamber 11 so that the input to the negative input port of comparator 142 represents the current voltage across the gas in the chamber less 50 volts. The output of voltage follower 141 is connected to the positive input port of comparator 142 and the junction of $R_{13}$ and $R_{14}$ is connected to the negative input port. When the subsequent voltage across the gas (less 50 volts) becomes greater than the prior voltage across the gas, the output of comparator 142 will go high. This is fed to one input port of an AND gate 143.

The gating of this circuitry is provided by the series arrangement of monostables 144, 145 and 146. A TIMING signal into the monostable 144 will cause its Q output to momentarily close switch 140 to impress the then existing voltage ($V_1$) on capacitor $C_4$. Subsequently the Q signal from monostable 144 triggers monostable 145 which in turn triggers monostable 146. The Q output of 146 is connected to the other input port of AND gate 143 and when the Q output goes high it enables AND gate 143. The use of the three monostables provides a time delay between the momentary closing of switch 140 and the enabling of gate 143 so that the $V_2$ and the $V_1$ signals which are compared for the other input to AND gate 143 will be separated in time.

The output of AND gate 143 is connected to the input of OR gate 131. When gate 143 goes high, indicating a differential of a predetermined fraction (for instance 50 volts) in the voltage across the gas in the chamber, OR gate 131 goes high. This causes A/D converter 132 to convert the then existing output of summing amplifier 120 and ultimately results in a new level of the PEDESTAL signal. Thus, as the glow discharge moves up the curve in the abnormal region, the PEDESTAL signal is automatically increased to correspond to the actual operating position. This updating of the PEDESTAL signal eventually ceases and the operation stabilizes at the position in the abnormal glow region determined by the preselected operating temperature of the workpiece.

The control circuit as thus far described provides instantaneous current levels which are sufficiently high to provide a strong glow condition. Also, the steady state PEDESTAL signal is sufficiently high that the workpiece temperature will slowly rise. The measured temperature of the workpiece is maintained about the operator selected operating temperature by use of a pulsed mode of operation. In this mode the current is supplied to the workpiece at least at the level responsive to the PEDESTAL signal. However, when the measured temperature is above the operating temperature it is provided in a pulsed manner.

Figure 6:
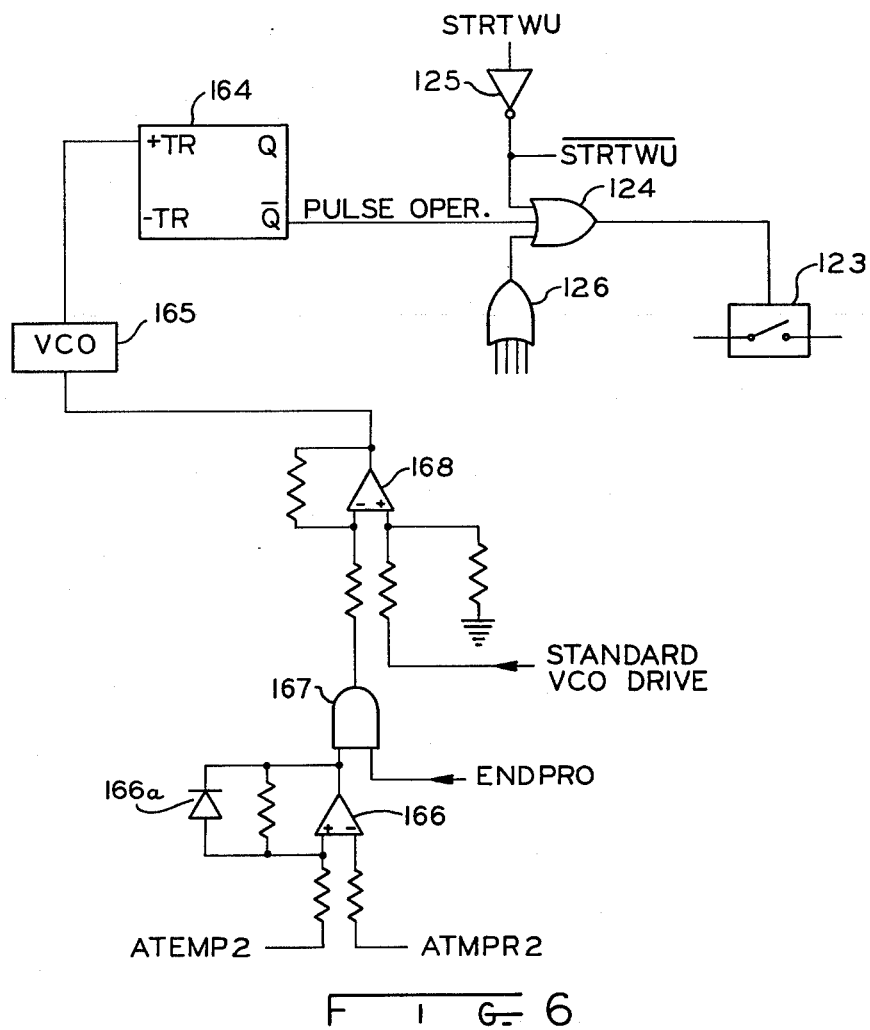
FIG. 6 is a simplified schematic circuit diagram illustrating a portion of the control system of FIG. 1 for providing pulsed operation.
Figure 7:
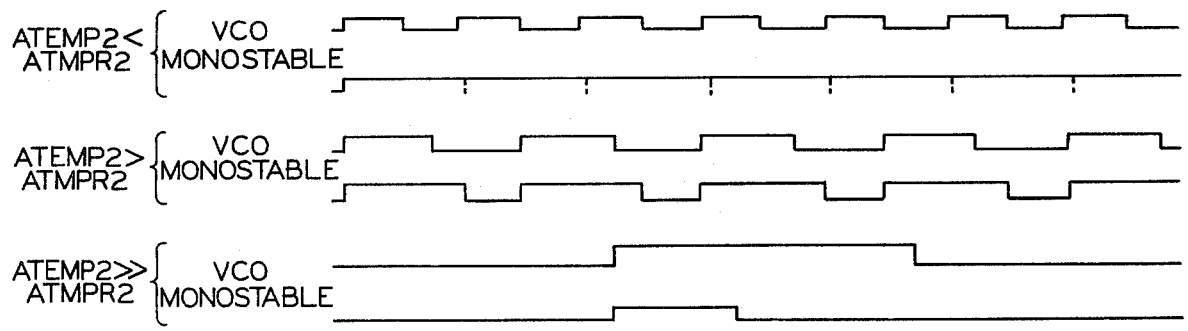
FIG. 7 is a composite timing diagram illustrating certain operating conditions of the pulse subsystem of FIG. 6.

Circuitry for providing the pulsed operation is shown in FIG. 6, is somewhat simplified form, and the operation is illustrated by the combined timing chart of FIG. 7. As shown in FIG. 6, a retriggerable monostable 164 is triggered by a voltage controlled oscillator (VCO) 165. The monostable has a standard pulse length slightly longer than the pulse length of the VCO when the VCO is driven by its Standard VCO Drive signal. If the Standard VCO Drive signal is the only input to VCO 165, monostable 164 will remain energized.

The latest measured temperature (ATEMP2) and the latest profile temperature (ATMPR2) are fed to a differential amplifier 166. If ATMPR2 is greater than ATEMP2, the difference signal from amplifier 166 is zero, since diode 166a will cause amplifier 166 to have zero gain for negative going outputs. If ATMPR2 is less than ATEMP2, the signal from amplifier 166 will take a non-zero value whose magnitude depends on the size of the difference. This difference signal is fed to AND gate 167, whose other input is the ENDPRO signal. Once the profile operation has ended the ENDPRO signal will be high, enabling AND gate 167, and the signal from amplifier 166 will be fed to a differential amplifier 168, as is the standard VCO Drive signal. Amplifier 168 subtracts, the difference signal (output of amplifier 166) from the Standard VCO Drive signal. If there is a non-zero value signal from amplifier 166, the drive signal from amplifier 168 to VCO 165 will cause the VCO frequency to go down (e.g. longer periods per cycle). The amount it goes down depends on the magnitude of the signal from amplifier 166. With a longer VCO period the period of monostable 164 will be shorter than the VCO period and continuous operation of the monostable will not occur. If not retriggered, the $\overline{Q}$ output of monostable 164 goes high (called PULSE OPER.). This causes the output of OR gate 124 to go high and close switch 123; which will remove current from the chamber to provide a pulsed operation.

The composite timing diagram of FIG. 7 illustrates three different operating conditions. The top pair of plots show the periods of VCO 165 and monostable 164 when ATEMP2 is less than ATEMPR2. In this case only the standard VCO Drive signal is applied to VCO 165; the VCO period is shorter than the monostable period; and monostable 164 is energized continuously. In the middle pair of plots ATEMP2 is slightly higher than ATMPR2. In this case the VCO period is slightly longer than the monostable period and the monostable is generally energized with intermittent short periods of deenergization. In the bottom pair of plots ATEMP2 is substantially higher than ATMPR2. In this case the monostable is on only a very small portion of the time to provide widely spaced pulses.

Figure 5:
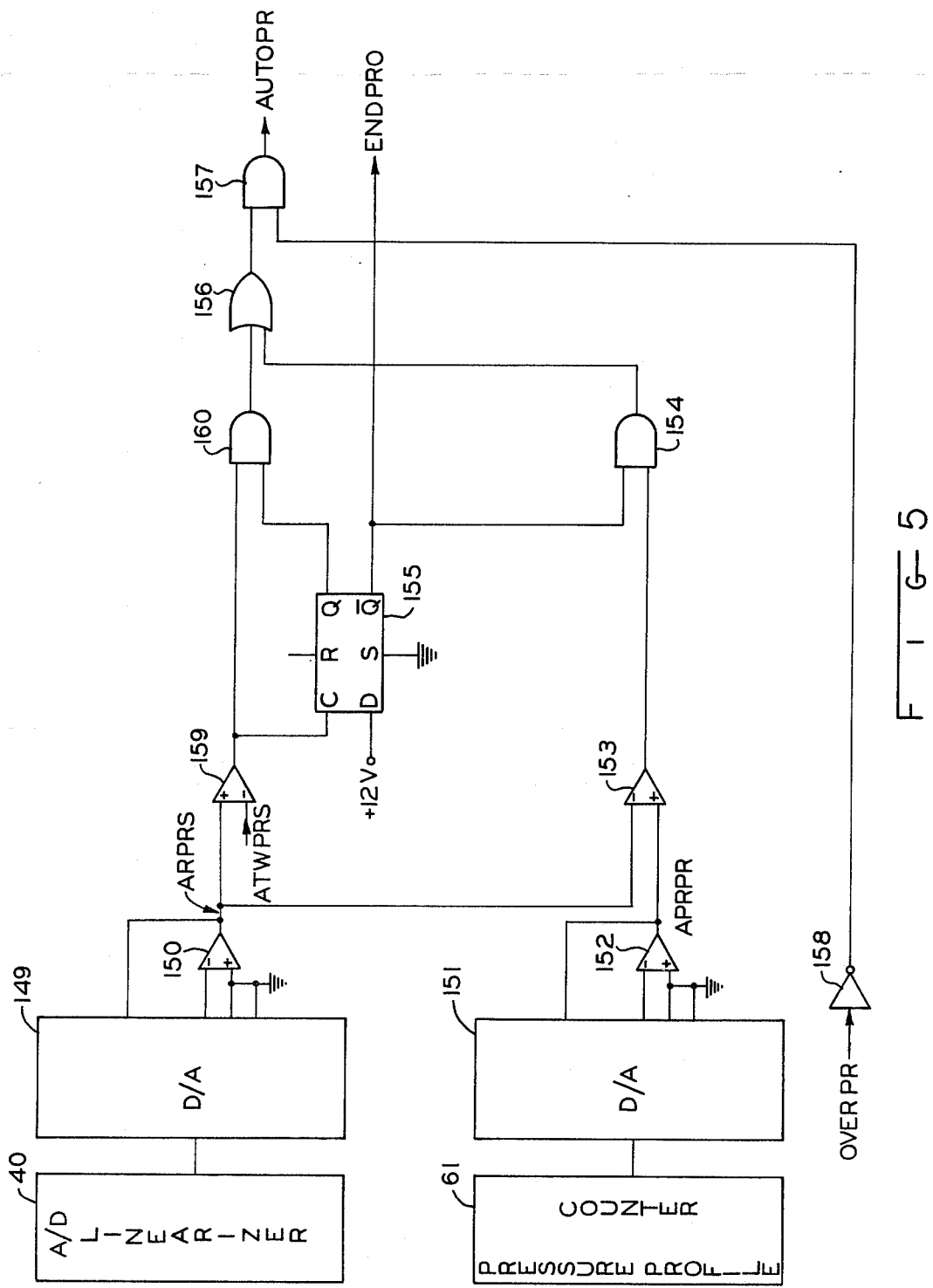
FIG. 5 is a simplified circuit diagram illustrating the pressure control subsystem of the control system of FIG. 1.

FIG. 5 illustrates a subsystem for providing pressure control. The A to D linearizer 40 provides an output signal representative of the measured pressure in the chamber and is connected to a digital to analog (D/A) converter 149. The output of D/A 149 is converted to a voltage by amplifier 150. The output signal of 150 is the analog of the real pressure (ARPRS). The pressure profile counter 61 is connected to a digital to analog converter 151, which converts the pressure profile signal to an analog signal that is converted to a voltage by amplifier 152. The output signal of amplifier 152 is the analog of the pressure profile (APRPR).

A comparator 153 compares the reel pressure (ARPRS) and the profile pressure (APRPR). If the profile pressure is greater than the reel pressure the output of amplifier 153 goes high. The output of amplifier 153 is fed to input port of AND gate 154. The other input of AND gate 154 comes from the $\overline{Q}$ port of a flip-flop 155 whose $\overline{Q}$ state is normally high. Hence AND gate 154 is enagled so long as $\overline{Q}$ of 155 is high and AND gate 154 output goes high when the output of comparator 153 goes high. The output of AND gate 154 is fed to an input port of OR gate 156. The output of OR gate 156 is an input for AND gate 157. The other input of AND gate 157 is the over pressure (OVERPR) inverted by inverter 158. Thus as long as the maximum operating pressure has not been exceeded AND gate 157 is enabled. If OR gate 156 goes high as the result of AND gate 154 going high the output of AND gate 157 goes high to provide the AUTOPR signal. This causes an increase in the gas pressure in the chamber. As discussed earlier, this may be accomplished by admitting additional gas to the chamber or by halting the withdrawal of atmosphere form the chamber.

The analog of the reel pressure (ARPRS) also is fed to comparator 159. The other input to the comparator 159 is the analog thumbwheel pressure signal (ATWPRS) which represents the operator's selected operating pressure. When the reel pressure goes higher than the operator selected process pressure the output of comparator 159 goes high. This triggers flip-flop 155 causing AND gate 154 to be disabled and changing the ENDPRO signal, connected to the pressure profile counter 61 (see FIG. 2). This terminates generation of the pressure profile. Thereafter pressure adjustment of the chamber is made as a result of comparing the operator selected pressure (ATWPRS) with the measured pressure (ARPRS). To this end the output of comparator 159 is fed to an AND gate 160 and the Q output of flip-flop 155 also is fed to AND gate 160. When comparator 159 first goes high, Q port goes high and stays high, enabling AND gate 160. The output of AND gate 160 is fed to the other input of OR gate 156.

From FIG. 8, it will be seen that a relatively high voltage is required to cause breakdown of the gas atmosphere into a discharge and, prior to breakdown very little current flows. Upon breakdown the current density increases substantially with no change in voltage. This is followed by a transition to the normal glow discharge. During tansition there is a substantial and almost instantaneous decrease in the required voltage. Any commercially available current source power supply has a finite slew rate and thus cannot instantaneously respond to these changes in the glow requirements. Thus, momentarily it may tend to overdrive the discharge at transition as it slews to the lower voltage level required by the glow discharge. Ballast resistance 16, connected between power supply 13 and the workpiece 12, assists the power supply to respond to this rapid change. With a control system in accordance with the present invention and current source power supplies, the ballast resistance is of a much smaller value than in resistance ballasted ion nitriding equipment of the prior art. For instance, an industrial sized ion nitriding furnace with a control system in accordance with the present invention has been operated successfully with ballast resistance of 100 ohms and less, depending on the size of the workpiece. Even though the ballast resistance is small, it may be desired to remove it from the circuit as soon as transition is over. By way of example, this can be accomplished by sensing the change in voltage representative of the transition and in response to that sensed signal triggering control rectifier 17 to short out the resistance.

Figure 10:
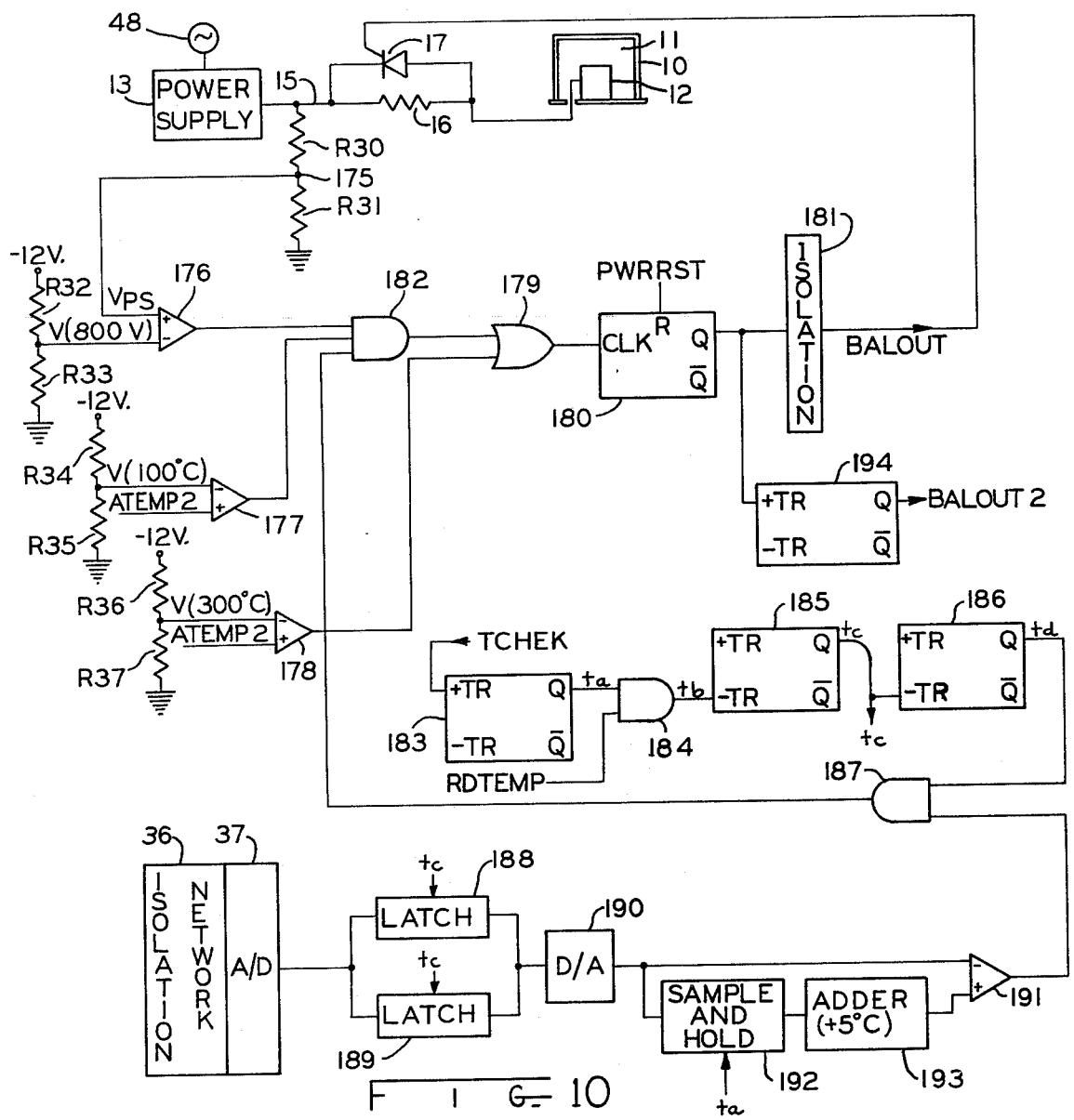
FIG. 10 is a circuit diagram, in somewhat simplified form, illustrating a subcircuit for bypassing the ballast resistance.

Streamers occurring during normal glow operation result in substantial changes in the resistance seen by the power supply and the presence of the ballast resistance in the circuit will help the power supply to respond to such streamers. In the normal glow region the current density is very low. This causes the total current flow from the power supply to the workpiece to be low, even though the workpiece may be large. The small current flow together with the small value of the resistance 16 means that the energy used in the ballast resistance during normal glow is relatively small. During abnormal glow discharge region of operation the resistance of the glow discharge is rather low and streamer activity results in less of a change in the resistance seen by the power supply. The power supply then responds more quickly to such changes. Also, in the abnormal glow region the current density is substantially higher and the resulting total current for any particular workpiece is greater. If the ballast resistance is then in the circuit, this higher current must flow through the resistance which may waste substantial energy and generate excess heat. Therefore, in many respects, it may be more desirable to leave the ballast resistance 16 in the circuit until the beginning of the abnormal glow discharge region and then remove it. By way of example, this can be done by sensing a change in the voltage which indicates entrance into the abnormal glow discharge region. Also, resistance 16 can be removed in response to a measured workpiece temperature value indicative that abnormal glow discharge has begun. FIG. 10 illustrates, in somewhat simplified form, circuitry for removing ballast resistance 16 from the circuit when the abnormal glow discharge region has been reached and, more particularly, in response to a measured workpiece temperature indicative of abnormal glow discharge region operation. In the example the measured workpiece temperature is chosen to be 300° C.

With very large workpieces the total current flow as abnormal glow discharge operation is approached will be relatively high. When the ballast resistance 16 is in the circuit, this current flows through this resistance, with a corresponding voltage drop. The presence of resistance 16 may cause a sufficient voltage drop that the apparatus is not able to establish a current density sufficiently high to cause the glow to successfully enter the abnormal glow discharge region. Thus, it may be advantageous to remove the ballast resistance in response to the power supply reaching an output voltage at least surrounding its maximum capability.

If there are substantial contaminants on the workpiece, the health circuitry will repeatedly turn off the power supply and the workpiece temperature will not rise. Failure of the workpiece to reach some minimum temperature, below that indicative of abnormal glow discharge operation, is an indication that substantial streamers may be occurring. In this circumstance it is advisable to leave the resistance 16 in the circuit, even though the power supply has approached its maximum operating voltage.

If the workpiece temperature is increasing at an acceptable rate it may be desirable to leave the resistance 16 in the circuit, even though the power supply is approaching its maximum voltage capability. For instance, if the glow is still in the normal glow discharge region, there may be fairly substantial streamer activity and the presence of the resistance 16 in the circuit is beneficial even though it is effectively slowing the rate at which the workpiece temperature is rising.

The ballast removal subcircuit, as illustrated in FIG. 10, also takes these factors into account in an alternate path for generating the ballast resistance removal signal.

Referring to FIG. 10, it will be seen that the supply line or lead 15 from power supply 13 to the load 12 is connected to ground by a resistance type voltage divider including resistances $R_{30}$ and $R_{31}$. The junction 175 between these resistances has a voltage level representative of the power supply voltage (indicated by $V_{PS}$) and this signal is fed to the non-inverting port of a comparator 176. Another divider network, including resistances $R_{32}$ and $R_{33}$, is connected between a reference voltage and ground so that the junction of R32 and R33 has a voltage level representative of a predetermined power supply voltage. In the circuit of FIG. 10, $R_{32}$ and $R_{33}$ are chosen so that this voltage level (labeled V(800V)) is representative of 800 volts at the power supply outlet. This signal is fed to the inverting port of comparator 176. When the output voltage of power supply 13 reaches predetermined maximum level, in the exemplification 800 volts, the output of comparator 176 goes high. The output of comparator is fed to the input of AND gate 182.

A second voltage divider, including resistances $R_{34}$ and $R_{35}$, is connected between a reference voltage and ground. $R_{34}$ and $R_{35}$ are sized such that the voltage at their junction is representative of a predetermined temperature of the workpiece. In the exemplification it is 100° C. and the signal is labeled V(100° C.). This signal is fed to the inverting port of a comparator 177. The noninverting port of the comparator 177 is connected to the latest measured workpiece temperature (ATEMP2). When the measured workpiece temperature rises above the reference temperature, e.g. 100° C., the output of comparator 177 goes high. The output of comparator 177 is fed to the input of AND gate 182.

A third voltage divider, including resistances $R_{36}$ and $R_{37}$, is connected between reference voltage and ground. These resistances are chosen so that their junction has a voltage representative of another, higher, temperature of the workpiece. In the exemplification this temperature is 300° C., as 300° C. is a workpiece temperature indicative that the glow discharge is firmly in the abnormal region. This junction is connected to the inverting port of comparator 178. The noninverting port of comparator 178 is connected to ATEMP2. When the measured workpiece temperature rises above 300° C. the output of comparator 178 will go high. Comparator 178 is connected through an OR gate 179 to the clock port of a flip flop 180, the Q output port of which is connected to an isolation circuit 181. When comparator 178 goes high the output of OR gate 179 goes high and the Q port of flip-flop 180 goes high. This high output (labeled BALOUT) of the isolation circuit is connected to the gate of controlled rectifier 17. Thus, a high BALOUT signal causes rectifier 17 to conduct and short out resistance 16. This effectively removes resistance 16 from the circuit between power supply 13 and workpiece 12.

A timing signal (TCHEK), obtained from the system control clock 91 (see FIG. 1) is fed to the +TR port of monostable 183. When TCHEK signal goes high the Q output ($t_a$) of monostable 183 goes high. This $t_a$ signal is fed to an AND gate 184. The other input signal to AND gate 184 is the RDTEMP signal from temperature analog to digital converter 37 (see FIG. 1). The RDTEMP signal goes high on a periodic basis such that it goes high once during each period that $t_a$ is high. This triggers AND gate 184 so that its output signal ($t_b$) goes high. The $T_b$ signal is fed to the −TR port of monostable 185. The trailing edge of the high $t_b$ signal causes the Q port signal ($t_c$) of monostable 185 to go high. The $t_c$ signal is fed to the −TR port of monostable 186 so that the trailing edge of this high signal causes the Q port signal ($t_d$) of monostable 186 to go high. The $t_d$ signal is fed to an AND gate 187.

A latch network, including a pair of latches 188 and 189, is connected to the temperature A/D converter 37 in order to latch a digital signal representative of the measured workpiece temperature. The $t_c$ signal is fed to the two latches 188 and 189 and triggers the latches to update their signal each time $t_c$ goes high. The output of latches 188 and 189 is fed to a digital to analog converter 190. The signal at the output of the converter 190 is representative of the measured workpiece temperature than latched by latches 188 and 189. The output of converter 190 is fed to the inverting port of a comparator 191. The output of converter 190 also is fed to the input of a sample and hold network 192 the trigger signal for which is $t_a$. The output of sample and hold network 192 is fed to an adder network 193 which is effective to add a voltage representative of a predetermined number of degrees, for instance 5° C., to the sample and hold network signal. The augmented sample and hold network signal output of adder 193 is fed to the noninverting port of comparator 191. When the output of adder network 193 is greater than the output of comparator 190 the output of comparator 191 will go high. The output of comparator 191 is fed to AND gate 187. Concurrent high states of the output of comparator 191 and signal $t_d$ cause the output of AND gate 187 to go high. This is the third input to AND gate 182.

Figure 11:
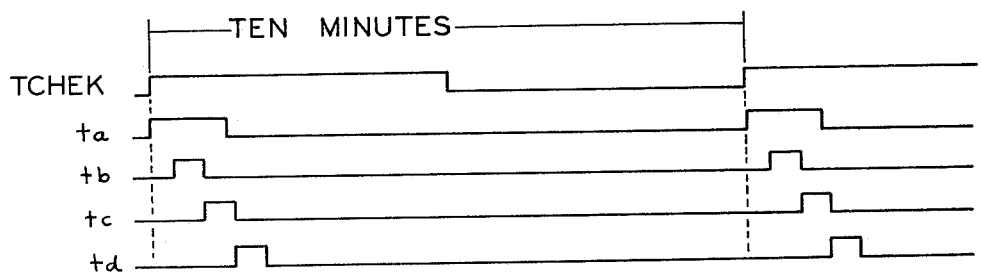
FIG. 11 is a composite timing diagram illustrating certain operating conditions of the subsystem of FIG. 10.

Turning now to FIG. 11 there is illustrated a sequence chart for the signals in the subcircuit just described. The TCHEK signal from system control clock 91 goes high once in each of successive measured periods, such as once each 10 minutes for instance. Each time the TCHEK signal goes high monostable 183 is triggered and the $t_a$ signal goes high for a predetermined length of time. The period of the $t_a$ signal is chosen so that the RDTEMP signal will go high once during each time the $t_a$ signal is high. In this regard it will be remembered that, in the exemplification, RDTEMP goes high once each 133 milliseconds. When both $t_a$ and RDTEMP are high AND gate 184 output ($t_b$) will go high. There is a time delay from signal $t_b$ to signal $t_c$ and from signal $t_c$ to signal $t_d$, as the trailing edge of signals $t_b$ and $t_c$ causes the generation of signals $t_c$ and $t_d$, respectively. This timing is used for proper triggering of latches 188 and 189 and sample and hold network 192. Signal $t_a$ triggers sample and hold network 192 so that it samples the output signal of D/A converter 190 and holds that signal. Shortly thereafter the $t_c$ signal causes the latches 188 and 189 to latch a new temperature signal from D/A converter 37. When $t_d$ goes high comparator 191 is comparing a new temperature level (output of adder 193). The time difference between temperature levels reflected by those two signals depends on the timing of the TCHEK signal, in the illustrative example the signals are 10 minutes apart. If the new signal is less than the old signal plus 5°, the output of comparator 191 goes high. After signal $t_c$ goes high, signal $t_d$ goes high. Thus if comparator 191 is high when signal $t_d$ goes high, AND gate 187 output will go high.

The output of AND gate 182 goes high if all three of its inputs are high. With the circuitry described, the input from comparator 176 will be high if the power supply is at least approaching its maximum operating voltage. The output of comparator 177 will be high if the measured workpiece temperature is above some minimum temperature, 100° C. for instance, and the output of AND gate 187 will go high if the measured temperature of the workpiece is not changed a predetermined amount such as 5° C. over a predetermined period of time, 10 minutes for instance.

The concurrent happening of all three of these events causes AND gate 182 to go high. This in turn triggers OR gate 179 and flip-flop 180 to generate the BALOUT signal. Once the flip-flop 180 is triggered to produce the BALOUT signal the Q output will stay high until a power reset (PWRRST) signal resets the flip flop. When controlled rectifier 17 is first triggered to short out resistance 16, it is desirable to momentarily turn off the power supply 13. However, it is not convenient to use the BALOUT signal for this purpose as all that is desired is a momentary interruption of the power supply. Therefore the Q output of flip-flop 180 is fed to the +TR port of a monostable 194. When the Q port of flip-flop 180 goes high the Q port of monostable 194 will go high momentarily. This high signal is labeled BALOUT2. Referring momentarily to FIG. 3 it will be remembered that BALOUT2 is one of the input signals to OR gate 126 and a high BALOUT2 signal will operate through OR gate 126 and OR gate 124 to momentarily close switch 123 for temporarily turning off power supply 13.

With the illustrative embodiment of the invention thus far described the control signal from summing amplifier 120 to the power supply 13 is used to control the available output current from the power supply. It has been assumed that the output voltage available from the power supply is constant. However, commercially available controllable current source power supplies also have the capability of having their available output voltage varied. In the illustrative embodiment of the present invention illustrated in FIGS. 12 and 13 the feature of available output voltage adjustment of controllable current source power supplies is utilized. More particularly the control system provides both a current drive (IDRIVE) signal and a voltage drive (VDRIVE) signal to the power supply. Based on the generated temperature profile, each of these inputs to the power supply is increased in a step-wise fashion. Also, generally speaking, they are increased alternately so that there is just sufficient voltage to provide the available current to the discharge as the current is increased in small steps. To this end the control system uses signals available from the power supply 13 which indicate that the supply has reached the limit of its available current (ILMT) and that is has reached the limit of its available voltage (VLMT). This alternate step-wise profiling of both the voltage drive and current drive to the controllable current source power supply assists in controlling the severity of any streamer activity as it even more effectively limits the available energy.

Figure 12A:
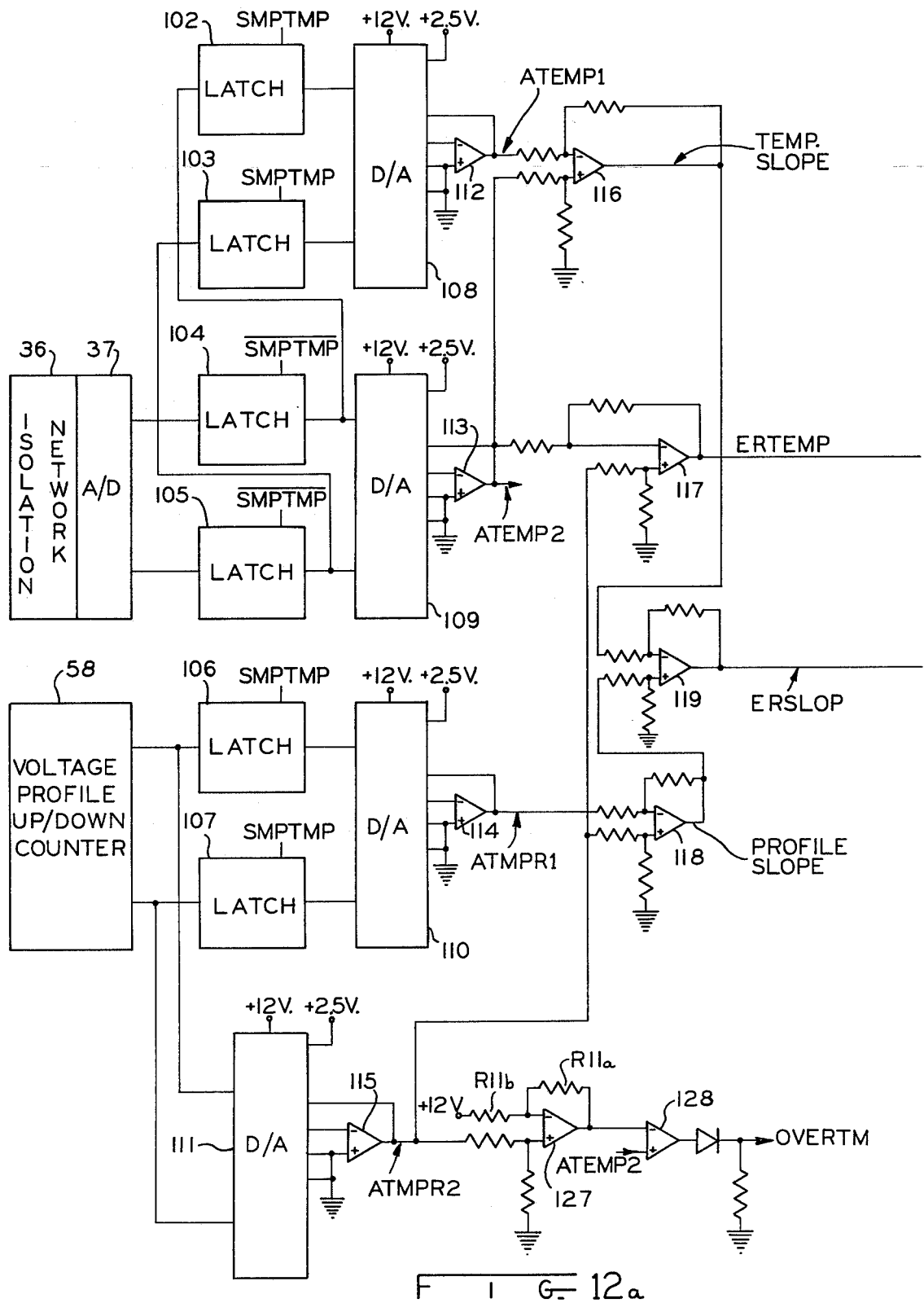
FIG. 12 is a simplified schematic circuit diagram illustrating the error signal and control portions of another exemplification embodiment in accordance with the present invention.
Figure 12B:
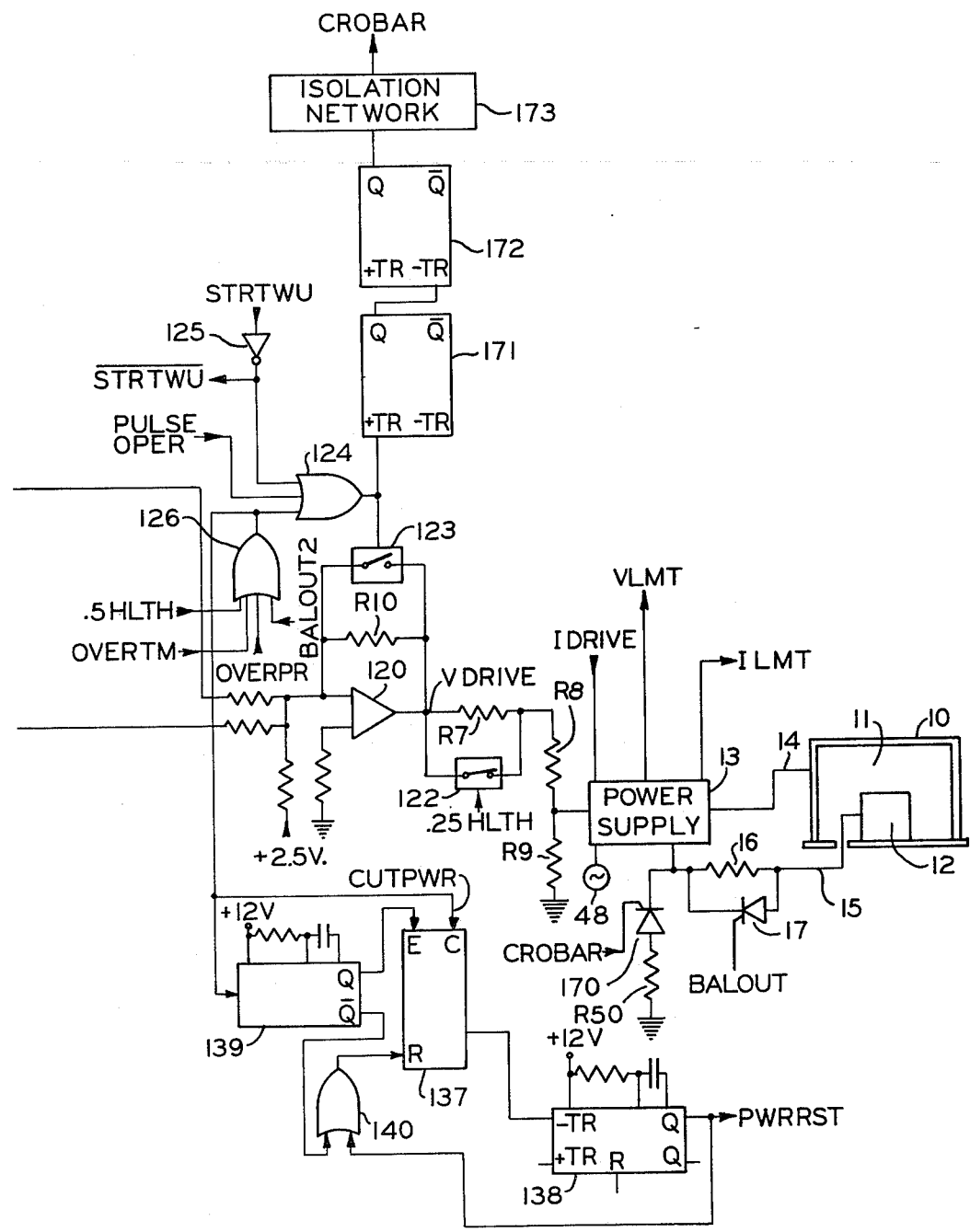

The error signal and control subcircuit illustrated in FIG. 12 is very similar to that shown in FIG. 3 and most of the components serve the same purpose. Such common components have been numbered with the same numbers as in FIG. 3 and the overall operation the subcircuit of FIG. 12 will only be described briefly. The profile up/down counter network 58 is the voltage up/down counter network used in generating the VDRIVE signal. There is a separate counter (206 in FIG. 13) used for the IDRIVE signal. The latest temperature profile signal ATMPR2 is no longer fed to the summing amplifier 120 and connection, including switch 121, is omitted from FIG. 12. The PEDESTAL signal has been removed from the input to summing amplifier 120 and replaced by a reference voltage, in the illustrative embodiment 2.5 volts. The reference voltage provides summing amplifier 120 with a minimum output which corresponds to some minimum voltage output capability of the power supply. Conveniently it may provide a minimum power supply available output voltage slightly less than is required to cause breakdown of the gas discharge. In the exemplification embodiment a reference voltage of 2.5 volts will result in a power supply available output voltage of approximately 400 volts. As the PEDESTAL signal is not utilized in the embodiment of FIGS. 12 and 13 the circuitry for providing and updating the PEDESTAL signal is not included in FIG. 12.

It will be noted that the power supply 13 receives a VDRIVE signal and an IDRIVE signal. In addition to providing power to the apparatus 10 and workpiece 12, power supply 13 provides two signal outputs labeled VLMT and ILMT. VLMT goes high when the power supply reaches the limit of its available voltage and ILMT goes high when the power supply reaches the limit of its available current output. It will be understood that the power supply could be operating with both VLMT and ILMT low, when it is operating well within the limits of its capability. Additionally either or both of the VLMT and ILMT signals can be high.

Figure 13:
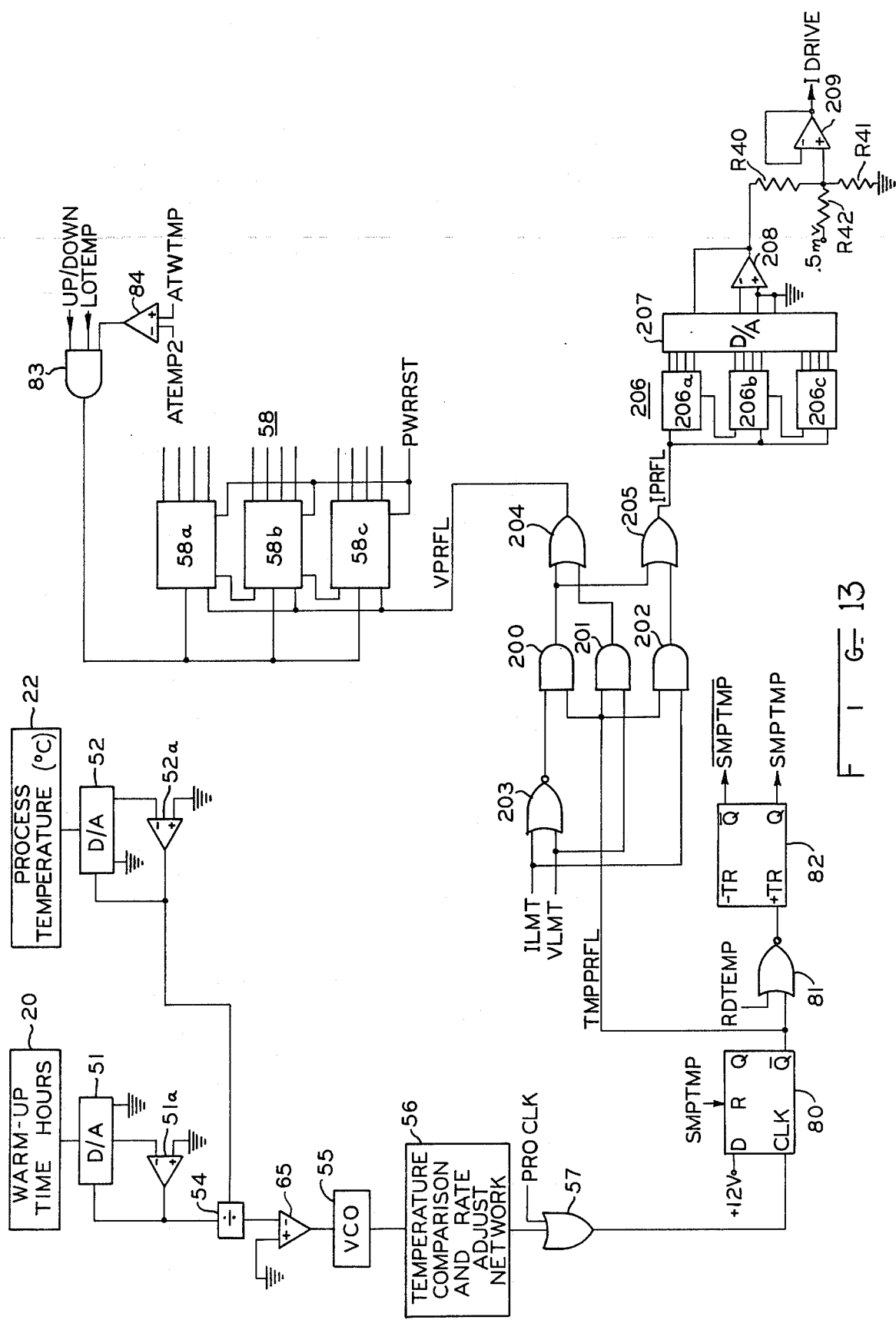
FIG. 13 is a simplified circuit diagram illustrating the voltage control profile and current control profile generation subcircuit for use with the subcircuit of FIG. 12.

FIG. 13 illustrates, in somewhat simplified form, a voltage and current drive profile circuit for use with the error and control circuit of FIG. 12. The operation of the circuit of FIG. 13 is very similar to the operation of the circuit of FIG. 2 and, therefore, parts have been numbered with the same designation and certain components have been omitted. For instance, the pressure profile is generated and utilized in the same manner as previously described and, therefore, the pressure profile circuitry has been omitted from FIG. 13.

The temperature profile network from operator warm-up time thumbwheel mechanism 20 and operator process temperature thumbwheel input mechanism 22 through one shot circuit 82, for providing the SMPTMP and $\overline{\text{SMPTMP}}$ signals, operates in exactly the same manner as this portion of the circuit of FIG. 2. As previously described, the output of flip flop 80 is a series of signals representative of the temperature profile. This temperature profile signal (TMPPREL) is fed to one input port of each of three AND gates 200, 201 and 202. The ILMT signal is fed to one port of a NOR gate 203 and to the other input port of AND gate 202. The VLMT signal is fed to the other input port of NOR gate 203 and the other input port of AND gate 201. The output of NOR gate 203 is fed to the other input port of AND gate 200. The output port of AND gate 200 is fed to one input port of an OR gate 204 and one input port of an OR gate 205. The output of AND gate 201 is fed to the other input port of OR gate 204 and the output of AND gate 202 is fed to the other input port of OR gate 205. The output of OR gate 204 (labeled VPRFL) is fed to the clock port of each of the counters 58a, 58b, 58c of the voltage profile up/down counter network 58. Network 58 is the same network as the temperature profile up/down counter of FIG. 2 and its other inputs are the same. It is labeled "voltage" rather than "temperature" in FIG. 13 as it counts the profile for the VDRIVE signal. The count accumulated on voltage profile up/down counter 58 is utilized in providing the control signals to summing amplifier 120 in essentially the same manner as described previously with regard to counter 58 in FIG. 3. In the present embodiment the output of summing amplifier 120 is used to vary the voltage control (VDRIVE) input to power supply 13.

The output of OR gate 205 (IPRFL) is fed to the clock port of each of three counters 206a, 206b and 206c forming a current profile counter 206. The signal on current counter network 206 is converted to an analog current value by a D/A converter 207. This current is converted to an equivalent analog voltage by amplifier 208. The output of amplifier 208 is connected to ground by voltage divider network including resistances $R_{40}$ and $R_{41}$. An amplifier 209 is connected to the junction of resistances $R_{40}$ and $R_{41}$ and its output is the current drive (IDRIVE) signal. A reference voltage is connected to the amplifier 209 through a limiting resistor $R_{42}$. This reference voltage is chosen to provide a minimum IDRIVE to provide a minimum available current from the power supply to the glow discharge. In the illustrative example a 0.5 millivolt reference voltage will provide a minimum available power supply current of 0.5 amps. Each pulse of the TMPPRFL signal should result in either the voltage profile counter network 58 or the current profile counter network 206 being incremented by one increment. It will be remembered that the signals ILMT and VLMT may be either both low, one low and one high, or both high. It also will be remembered that the UP/DOWN signal and the LO-TEMP signal boh act on the voltage profile u/down counter to cause it to count down and that comparator 84 will disable counter 58 from further up counts when the measured temperature reaches the thumbwheel temperature. The network including gates 200-205 inclusive functions as follows. When ILMT is high and VLMT is low a high TMPPRFL pulse will result in the current profile counter network 206 being incremented up by one increment. At all other times a high TMPPRFL pulse will result in the voltage profile up/down counter network 58 being incremented one increment. Whether the network 58 is incremented up or down depends on the output status of AND gate 83, as previously described with regard to the subcircuit illustrated in FIG. 2.

The 2.5 volt reference signal to summing amplifier 120 will cause power supply 13 to have an available voltage to about 400 volts and the 0.5 millivolt reference signal to amplifier 209 will cause the power supply 13 to have available current output of about 0.5 amps. The actual breakdown voltage required to begin a glow discharge depends on the pressure in the chamber and the temperature of the gas; however, as seen in FIG. 8, it is somewhat higher than 400 volts. At the beginning of an operation the power supply would be operating within its current delivery capability and within its available voltage capability. The temperature profile counter initially will cause the voltage profile up/down counter network 58 to increment upwardly until the breakdown voltage for the particular glow discharge is reached. At breakdown a glow discharge is initiated and a relatively low level current begins to flow between the power supply and the discharge. The glow quickly transitions into the normal glow discharge region, in which the current density is somewhat higher and the voltage requirement is somewhat lower. At this time the power supply probably will be operating within both of its current and voltage limits and the network of gates 200-205 will cause the voltage profile up/down counter 58 to be incremented. In the normal glow discharge region the glow will be undergoing a number of streamers and the health circuit will act to cause the voltage profile to be incremented both up and down depending on the streamer activity. At some point, depending on the size of the workpiece, the 0.5 amp current output capability of the power supply will be reached. At that time the ILMT signal will go high and as soon as the VLMT goes low the current counter 206 will be incremented. From this point on the two counters 58 and 206 are incremented in essentially an alternative fashion. When the load resistance times the current drawn exceeds the voltage output capability of the power supply, the voltage counter 58 will be incremented upwardly slightly. Then, when the available voltage and the impedance of the load exceed the current capability of the power supply the current counter 206 is incremented slightly. This alternate incrementing of the counter continues until the measured workpiece temperature reaches the thumbwheel processing temperature.

It should be apparent to those skilled in the art that, while I have described what I presently consider to be the preferred embodiments of my invention in accordance with the patent statutes, changes may be made in the disclosed embodiments without actually departing from the true spirit and scope of the invention.

What I claim as new and desire to secure by Letters Patent of the United States is:

1. A control system for an apparatus for the glow discharge treatment of a workpiece, the apparatus including a housing forming a chamber to receive a workpiece and a low pressure ionizable gas atmosphere and means for establishing a glow discharge with the workpiece connected as the cathode; said control system including:

reference means for providing a reference signal having an increasing value based on a predetermined time related increase in the temperature of the workpiece as the workpiece is heated to a predetermined operating temperature; and temperature measurement means for measuring the temperature of the workpiece and providing a temperature signal representative of the measured temperature of the workpiece;

said reference means being connected to said temperature measurement means and adapted to reduce the rate of increase of the reference signal value as the measured temperature of the workpiece approaches the operating temperature of the workpiece.

2. A control system for an apparatus for the glow discharge treatment of a workpiece, the apparatus including a housing forming a chamber to receive a workpiece and a low pressure ionizable gas atmosphere and means for establishing a glow discharge with the workpiece connected as the cathode; said control system including:

reference means for providing a reference signal having an increasing value based on a predetermined time related increase in the temperature of the workpiece as the workpiece is heated to a predetermined operating temperature;

temperature measurement means for measuring the temperature of the workpiece and providing a temperature signal representative of the measured temperature of the workpiece, said reference means being connected to said temperature measurement means and adapted to reduce the rate of increase of the reference signal value as the measured temperature of the workpiece approaches the operating temperature of the workpiece;

said reference means including:

oscillation means for providing a series of signals at a frequency based on the predetermined time related increase in the temperature of the workpiece;

accumulation means for accumulating the oscillation signals to form a signal value, the accumulated signal value providing a reference temperature input for said control system, the frequency of the oscillation means providing an accumulated signal value increasing at a rate greater than the predetermined increase per unit of time in the temperature of the workpiece; and interconnection means connecting said oscillation means with said accumulation means and effective initially to provide signals to said accumulation means at the frequency of the oscillation means and thereafter to reduce the rate at which signals are provided to said accumulation means as the measured temperature of the workpiece approaches the workpiece operating temperature.

3. A control system for an apparatus for the glow discharge treatment of a workpiece, the apparatus including a housing forming a chamber to receive a workpiece and a low pressure ionizable gas atmosphere and means for establishing a glow discharge with the workpiece connected as the cathode; said control system including:

reference means for providing a reference signal having an increasing value based on a predetermined time related increase in the temperature of the workpiece as the workpiece is heated to a predetermined operating temperature; and temperature measurement means for measuring the temperature of the workpiece and providing a temperature signal representative of the measured temperature of the workpiece;

said reference means being connected to said temperature measurement means and adapted to reduce the rate of increase of the reference signal value as the measured temperature of the workpiece approaches the operating temperature of the workpiece;

said reference means including oscillation means for providing a series of signals at a frequency based on the predetermined time related increase in the temperature of the workpiece; accumulation means for accumulating the oscillation signals to form a signal value, the accumulated signal value providing a reference temperature input for said control system, the frequency of the oscillation means providing an accumulated signal value increasing at a rate greater than the predetermined increase per unit of time in the temperature of the workpiece; interconnection means connecting said oscillation means with said accumulation means and effective initially to provide signals to said accumulation means at the frequency of the oscillation means and thereafter to reduce the rate at which signals are provided to said accumulation means as the measured temperature of the workpiece approaches the workpiece operating temperature;

said control system also including means adapted to provide a signal indicative of initiation of glow discharge;

said interconnection means including a counter having an input and first and second outputs and adapted to provide output signals based on the signals to said input with the rate of signals from said first output being lower than the rate of the signals to said input and the rate of signals from said second output being lower than the rate of the signals from said first output; and said interconnection means operatively connecting said input of said counter to said oscillation means and said first output of said counter to said accumulation means upon the occurrence of the signal indicative of initiation of glow discharge and disconnecting said first output and operatively connecting said second output to said accumulation means upon the measured temperature of the workpiece reaching a first predetermined temperature less than the workpiece operating temperature.

4. A control system as set forth in claim 3, wherein:

said counter also includes a third output, the rate of the signals from said third output being lower than the rate of signals from said second output; and said interconnection means disconnects said second output and operatively connects said third output to said accumulation means upon the workpiece measured temperature reaching a second predetermined temperature between the first predetermined temperature and the workpiece operating temperature.

5. A control system as set forth in claim 3; further including:

means for sensing an unhealthy condition of the glow discharge;

means connected to said sensing means for accumulating the value of such sensed unhealthy condition; and said oscillation signal accumulation means being connected to said unhealthy condition accumulation means and effective to reduce the accumulated oscillation signal value by at least one signal increment in response to the sensed unhealthy condition reaching a predetermined value.

6. A control system for an apparatus for the glow discharge treatment of a workpiece, the apparatus including a housing forming a chamber to receive a workpiece and a low pressure ionizable gas atmosphere, means for establishing a glow discharge with the workpiece connected as the cathode, and a power supply for supplying electrical energy for the glow discharge; said control system including:

control means for providing a control signal to the power supply for controlling the amount of electrical energy supplied to the glow discharge;

reference means for providing a reference signal having an increasing value representative of a predetermined time related increase in the temperature of the workpiece as the workpiece is heated to a predetermined operating temperature;

temperature measurement means for measuring the temperature of the workpiece and providing a temperature signal having a value representative of the measured temperature of the workpiece; and comparator means connected to said reference means and to said temperature measurement means for comparing a contemporaneous reference signal and temperature signal and providing a comparison result signal;

said control means being connected to said comparator means and effective to provide to the power supply to control signal which reflects the comparison result signal;

said control system including first latching means connected to said reference means for retaining the reference signal value for an earlier time and the reference signal value for a subsequent time;

said control system also including second latching means connected to said temperature measurement means for retaining the temperature signal value for the earlier time and the temperature signal value for the subsequent time;

said comparator means including a first comparator connected to said first and second latching means for comparing the temperature signal value and the reference signal value for the subsequent time and providing a resultant temperature error signal;

said comparator means also including a second comparator connected to said first latching means for comparing the two reference signal values and providing a resultant reference slope signal, a third comparator connected to said second latch means for comparing the two temperature signal values and providing a resultant temperature slope signal and a fourth comparator connected to said second and third comparators for comparing the reference slope signal and the temperature slope signal and providing a resultant slope error signal; and said control means being connected to said first and fourth comparators and effective to provide to the power supply a control signal which reflects both the temperature error and the slope error signals.

7. A control system as set forth in claim 6, wherein:

said control system also includes means for providing a signal indicative of initiation of glow discharge;

said control system further includes pedestal means connected to said control means and responsive to the occurrence of the signal indicative of initiation of glow discharge for generating and retaining a pedestal signal representative of the then existing electrical energy output of the power supply; and means including switch means, for supplying to said control means the signal representative of the extant measured temperature of the workpiece; said switch means being adapted to interrupt the supply of the signal representative of the extant measured temperature of the workpiece upon the occurance of the signal indicative of glow discharge initiation; so that said control means is effective to provide to the power supply a control signal which also reflects the signal representative of the extant measured temperature of the workpiece until initiation of glow discharge and thereafter reflects the pedestal signal.

8. A control system for an apparatus for the flow discharge treatment of a workpiece, the apparatus including a housing forming a chamber to receive a workpiece and a low pressure ionizable atmosphere and means for establishing a glow discharge with the workpiece connected as the cathode, and a power supply for providing electrical energy for the glow discharge; said control system including:

a summing amplifier adapted to receive a plurality of input signals and provide an output signal reflecting a summation of its input signals, the output signal being connected to the input of said power supply for controlling the level of electrical energy provided by said power supply;

signal means for providing a signal indicative of initiation of glow discharge;

reference means for providing a reference signal having an increasing value representative of a predetermined time related increase in the temperature of the workpiece as the workpiece is heated to a predetermined operating temperature;

switch means interconnecting said amplifier and said reference means, said switch means being connected to said signal means and effective for inputting the reference signal to said amplifier until the occurrence of the signal indicative of glow discharge initiation and thereupon terminating such input; and pedestal means connected to said signal means and to said amplifier and responsive to the occurrence of the signal indicative of glow discharge initiation for generating and inputting to said amplifier a pedestal signal representative of the amplifier output signal at that time.

9. A control system as set forth in claim 8 further including:

temperature measurement means for measuring the temperature of the workpiece and providing a temperature signal having a value representative of the measured workpiece temperature;

first latching means connected to said reference means for retaining the reference signal value for an earlier time and the reference signal value for a subsequent time;

second latching means connected to said temperature measurement means for retaining the temperature signal value for the earlier time and the temperature signal value for the subsequent time;

first comparator means connected to said first and second latching means and to said amplifier for comparing the reference signal value and the temperature signal value for the subsequent time and inputting to said amplifier a resultant temperature error signal;

second comparator means connected to said first latching means for comparing the two reference signal values and providing a resultant reference slope signal;

third comparator means connected to said second latching means for comparing the two temperature signal values and providing a resultant temperature slope signal; and fourth comparator means connected to said second and third comparator means and to said amplifier for comparing the reference slope signal and temperature slope signal and inputting to said amplifier a resultant slope error signal.

10. A control system as set forth in claim 9, in which the power supply is adapted to supply electrical energy at a level responsive to the voltage level of the signal impressed on its input; wherein said control system also includes means adapted to sense an unhealthy state of the glow discharge and, in response to a predetermined sensed unhealthy state, to connect a resistance between said summing amplifier and said input of said power supply for reducing the voltage level of the signal impressed on said input.

11. A control system for an apparatus for the glow discharge treatment of a workpiece; the apparatus including a housing forming a chamber to receive a workpiece and a low pressure ionizable gas atmosphere; a controllable current source power supply for supplying electrical energy for the glow discharge with the workpiece connected as the cathode; said control system including:

oscillation means for providing a series of signals based on a predetermined time related increase in the workpiece temperature as the workpiece is heated to its operating temperature;

first accumulation means for connection to a voltage input of the power supply to vary the available voltage of the power supply output responsive to the accumulated signal level of said first accumulation means, said first accumulation means being connected to said oscillation means for accumulating signals from said oscillation means; and second accumulation means for connection to a current input of the power supply to vary the available current of the power supply output responsive to the accumulated signal level of said second accumulation means said second accumulation means being connected to said oscillation means for accumulating signals from said oscillation means.

12. A control system as set forth in claim 11, in which the power supply provides a voltage signal responsive to power supply operation at the limit of its available voltage and a current signal responsive to power supply operation at the limit of its available current; further including:

interconnection means adapted to receive voltage and current signals from the power supply, said interconnecting means connecting said oscillation means with said first and second accumulation means and responsive to voltage and current signals for directing signals from from said oscillation means to said first and second accumulation means respectively; so that oscillation means signals are accumulated by said first and second accumulation means substantially in an alternating fashion.

13. A method of controlling the operation of a glow discharge apparatus which includes a chamber to receive a workpiece and a low pressure ionizable gas atmosphere and means for establishing a glow discharge in the atmosphere with the workpiece connected as the cathode; in which a predetermined increase in the voltage level of the electrical energy supplied to the glow discharge over a predetermined time interval is indicative that the glow discharge is in the abnormal glow discharge region; said method including the steps of:

providing electrical energy to the glow discharge at a level to maintain a predetermined operating temperature of the workpiece;

sensing the occurrence of an incipient arcing condition of the glow discharge;

temporarily incrementally reducing the level of electrical energy in response to a sensed incipient arcing condition;

repeatedly measuring, at predetermined time intervals, the voltage of the supplied electrical energy;

comparing successive voltage measurements; in response to a comparison indicating glow discharge in the abnormal region, generating a pedestal signal representative of the extant level of electrical energy provided to the glow discharge at that time; and thereafter providing electrical energy to the glow discharge at a level consistent with the pedestal signal.

14. A method of controlling the operation of a glow discharge apparatus which includes a chamber to receive a workpiece and a low pressure ionizable gas atmosphere and means for establishing a glow discharge with the workpiece connected as the cathode; said method including steps of:

provising a reference rate of change signal representative of a desired rate of increase in the temperature of the workpiece;

generating a series of temperature signals representative of the actual workpiece temperature;

producing a temperature rate of change signal representative of the rate of change of the temperature signals;

comparing the reference rate of change signal and the temperature rate of change signal; and providing electrical energy to the glow discharge at a level reflecting the result of such comparison.

* * * * *

UNITED STATES PATENT AND TRADEMARK OFFICE
CERTIFICATE OF CORRECTION

PATENT NO. : 4,331,856

DATED : May 25, 1982

INVENTOR(S) : Nicholas F. D'Antonio

It is certified that error appears in the above—identified patent and that said Letters Patent is hereby corrected as shown below:

Title page, under "References Cited", after "Staad et al." change "250/53" to --250/531--.

Title page, under "Other Publications", change "Gartne" to --Gartner--.

Column 5, line 1, change "somehwat" to --somewhat--; line 50, change "considereable" to --considerable--.

Column 10, line 57, after "amount" delete --of--.

Column 11, line 32, change "cone" to --come--; line 60, change "of" to --to--.

Column 12, line 31, change "ampiflier" to --amplifier--.

Column 13, line 22, change "connected" to --connection--.

Column 14, line 51, " $\overline{Q}$ " should read -- Q --.

Column 15, line 51, change "wil" to --will--.

Column 16, line 5, change "subsytem" to --subsystem--.

Column 17, line 9, change "connectedto" to --connected to--; line 59, change "DOWM" to --DOWN--.

Column 18, line 29, change "voltae" to --voltage--; line 56, change "outputof" to --output of--.

UNITED STATES PATENT AND TRADEMARK OFFICE
CERTIFICATE OF CORRECTION

PATENT NO. : 4,331,856
DATED : May 25, 1982
INVENTOR(S) : Nicholas F. D'Antonio

It is certified that error appears in the above—identified patent and that said Letters Patent is hereby corrected as shown below:

Column 19, line 29, change "voltge" to --voltage--; line 30, change "voltae" to --voltage--; line 30, change "ATEMPT2" to --ATEMP2--.

Column 20, line 32, after "105" insert --is--; line 37, after "105" delete --are--; line 57, change "SMPTMP" to --$\overline{\text{SMPTMP}}$--.

Column 22, line 3, after "output" delete --voltage--.

Column 25, line 10, change "139" to --139a--; line 47, change "is", first occurrence, to --it--.

Column 26, line 66, change "is" to --in--.

Column 27, line 62, change "reel" to --real--; line 64, change "reel" to --real--.

Column 28, line 1, change "enagled" to --enabled--; line 41, change "tansition" to --transition--.

Column 29, line 46, change "surrounding" to --approaching--.

Column 31, line 15, change "than" to --then--.

Column 34, line 30, change "boh" to --both--; line 30, change "u/down" to --up/down--; line 47, change "to" to --of--.

UNITED STATES PATENT AND TRADEMARK OFFICE
CERTIFICATE OF CORRECTION

PATENT NO. : 4,331,856
DATED : May 25, 1982
INVENTOR(S) : Nicholas F. D'Antonio

It is certified that error appears in the above—identified patent and that said Letters Patent is hereby corrected as shown below:

Column 38, line 55, change "flow" to --glow--.

Signed and Sealed this

Twenty-third Day of November 1982

[SEAL]

Attest:

GERALD J. MOSSINGHOFF

Attesting Officer     Commissioner of Patents and Trademarks